United States Patent
Komatsu et al.

(10) Patent No.: US 9,768,328 B2
(45) Date of Patent: Sep. 19, 2017

(54) TRANSPARENT FILM, TRANSPARENT ELECTRO-CONDUCTIVE LAMINATE, AND TOUCH PANEL, SOLAR CELL, AND DISPLAY DEVICE USING THE SAME

(75) Inventors: Shinichi Komatsu, Tokyo (JP); Akira Shiibashi, Tokyo (JP); Rieko Fujishiro, Tokyo (JP); Ryuichi Ueno, Tokyo (JP); Takaya Matsumoto, Tokyo (JP)

(73) Assignee: JX NIPPON OIL & ENERGY CORPORATION, Tokyo (JP)

( * ) Notice: Subject to any disclaimer, the term of this patent is extended or adjusted under 35 U.S.C. 154(b) by 673 days.

(21) Appl. No.: 14/237,635

(22) PCT Filed: Aug. 3, 2012

(86) PCT No.: PCT/JP2012/069840
§ 371 (c)(1),
(2), (4) Date: Apr. 10, 2014

(87) PCT Pub. No.: WO2013/021942
PCT Pub. Date: Feb. 14, 2013

(65) Prior Publication Data
US 2014/0224318 A1 Aug. 14, 2014

(30) Foreign Application Priority Data

Aug. 8, 2011 (JP) ................................. 2011-173204
Jan. 31, 2012 (JP) ................................. 2012-019090

(51) Int. Cl.
*H01L 31/0224* (2006.01)
*C08G 73/10* (2006.01)
(Continued)

(52) U.S. Cl.
CPC ...... *H01L 31/022466* (2013.01); *C08G 73/10* (2013.01); *C08G 73/105* (2013.01);
(Continued)

(58) Field of Classification Search
CPC ........ H01L 31/0392; H01L 31/022466; C08G 73/1078; C08G 73/1042; C08G 73/105;
(Continued)

(56) References Cited

U.S. PATENT DOCUMENTS 8,629,303 B2    1/2014 Komatsu et al.
2008/0115831 A1*  5/2008 Kang ................... H01G 9/2004
                                                    136/263
(Continued)

FOREIGN PATENT DOCUMENTS

EP    2 535 324 A1    12/2012
EP    2 535 341 A1    12/2012
(Continued)

OTHER PUBLICATIONS

International Preliminary Report on Patentability issued against International Application PCT/JP2012/069840.
(Continued)

*Primary Examiner* — Matthew Martin
(74) *Attorney, Agent, or Firm* — Oliff PLC

(57) ABSTRACT

A transparent electro-conductive laminate comprising:
  a substrate film made of a polyimide; and
  a thin film made of an electro-conductive material and stacked on the substrate film, wherein
  the polyimide is a polyimide
    containing at least one repeating unit represented by the following general formula (1):

[Chem. 1]

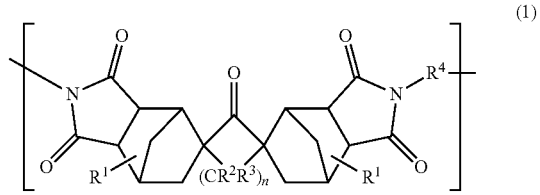

[in the formula (1), $R^1$, $R^2$, and $R^3$ each independently represent one selected from the group consisting of a hydrogen atom, alkyl groups having 1 to 10 carbon atoms, and a fluorine atom, $R^4$ represents an aryl group having 6 to 40 carbon atoms, and n represents an integer of 0 to 12], (Continued)

having a glass transition temperature of 350° C. to 450° C., and having a linear expansion coefficient of 30 ppm/° C. or less, the linear expansion coefficient being determined by measuring change in length under a nitrogen atmosphere and under a condition of a rate of temperature rise of 5° C./minute in a temperature range from 50° C. to 200° C.

6 Claims, 7 Drawing Sheets

(51) Int. Cl.
- *H01L 31/0392* (2006.01)
- *C08L 79/08* (2006.01)
- *C08G 73/14* (2006.01)

(52) U.S. Cl.
CPC ..... *C08G 73/1042* (2013.01); *C08G 73/1078* (2013.01); *C08G 73/14* (2013.01); *C08L 79/08* (2013.01); *H01L 31/0392* (2013.01); *Y02E 10/50* (2013.01); *Y10T 428/31721* (2015.04)

(58) Field of Classification Search
CPC ......... C08G 73/14; C08G 73/10; Y02E 10/50; C08L 79/08
See application file for complete search history.

(56) References Cited

U.S. PATENT DOCUMENTS

| | | | |
|---|---|---|---|
| 2012/0142829 A1* | 6/2012 | Ichinose | C08G 73/14 524/99 |
| 2012/0310013 A1 | 12/2012 | Komatsu et al. | |
| 2013/0079490 A1 | 3/2013 | Matsumoto et al. | |
| 2015/0158980 A1 | 6/2015 | Oka et al. | |
| 2015/0307662 A1 | 10/2015 | Oka et al. | |

FOREIGN PATENT DOCUMENTS

| | | | | |
|---|---|---|---|---|
| JP | 2004-111152 A | 4/2004 | | |
| JP | 2010-184898 A | 8/2010 | | |
| JP | WO 2010137548 A1 * | 12/2010 | ............ | C08G 73/14 |
| JP | 2011-162479 A | 8/2011 | | |
| WO | 2011/099518 A1 | 8/2011 | | |

OTHER PUBLICATIONS

Written Opinion of the International Searching Authority issued against International Application PCT/2012/069840.

Notice for Reasons for Rejection issued on Nov. 24, 2015 for corresponding Japanese patent application No. 2013-528008, and the English translation thereof.

Ryosuke Kimura et al. "Colorless and Thermally Stable Polymer-An Alicyclic Polyimide with Cyclopentanone Bis-spironorbomane Structure", Japanese Journal of Polymer Science and Technology, vol. 68, No. 3, pp. 127-131.

International Search Report dated Sep. 4, 2012, issued in International Application PCT/JP2012/069840.

Ryosuke Kimura; Toshihiko Matsumoto, "Colorless and Thermally Stable Polymer-An Alicyclic Polymide with Cyclopentanone Bis-spironorbomame Structure", Kobunshi Ronbunshu, Japanese Journal of Polymer Science and Technology, vol. 68, No. 3, Mar. 25, 2011, pp. 127-131.

Extended European Search Report issued on Mar. 6, 2015 in the corresponding European Patent Application No. 12822029.0.

Masatoshi Kusama et al.: "Soluble Polymides with Polyalicyclic Structure. 3.1. Opolymides from (4arH, 8acH)—Decahydro-It, 4t:5c, 8c-Dimethanonaphthalene-2t,3t,6c,7c-Tetracarboxylic 2,3:6,7-Dianhydride", Macromolecules, American Chemical Society, vol. 27, No. 5, Feb. 28, 1994 (Feb. 28, 1994), pp. 1117-1123, XP000433176, ISSN: 0024-9297, DOI: 10.1021/MA00083A008.

* cited by examiner

[Fig.1]
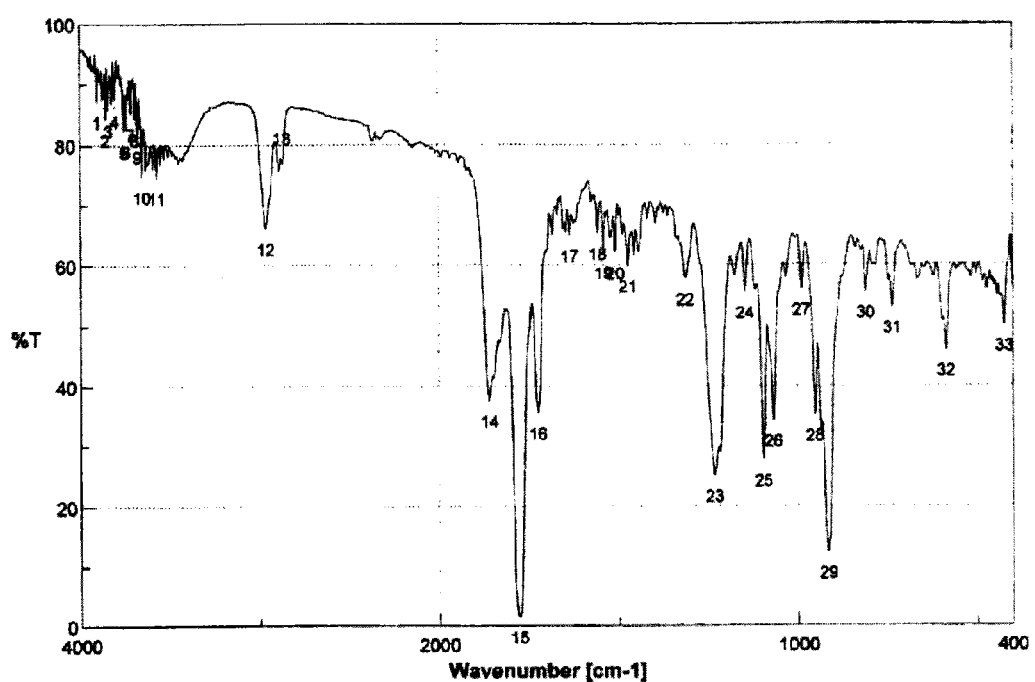

[Fig.2]
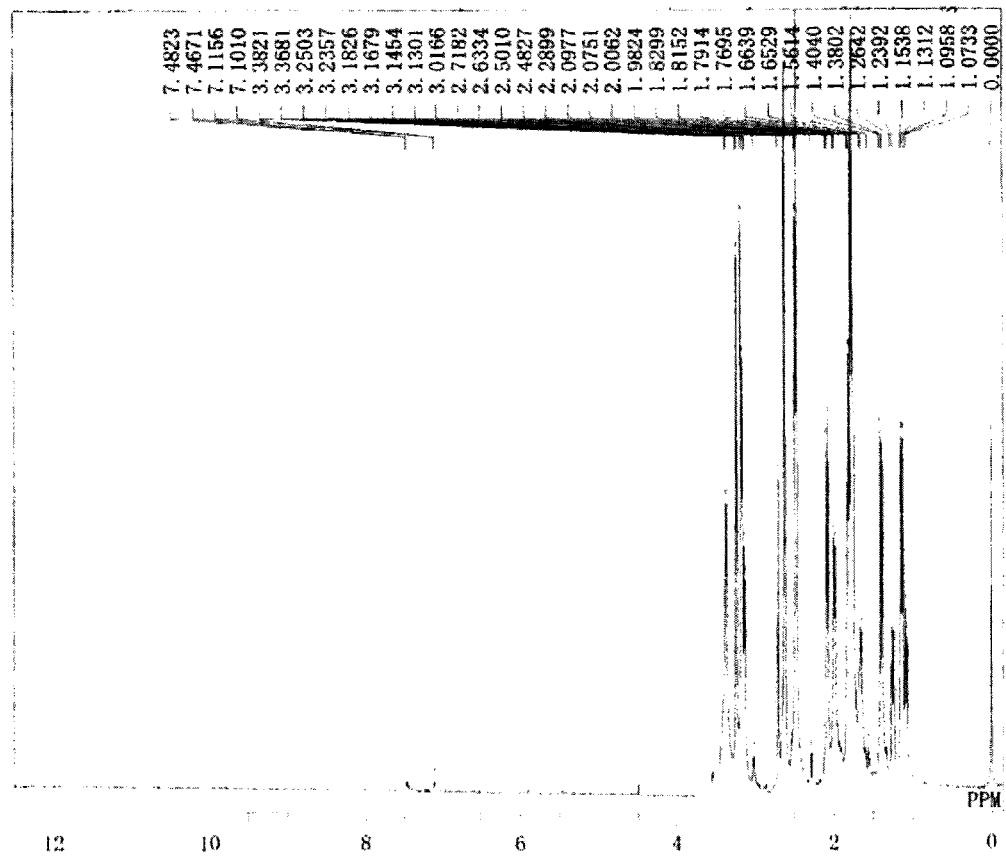

[Fig.3]
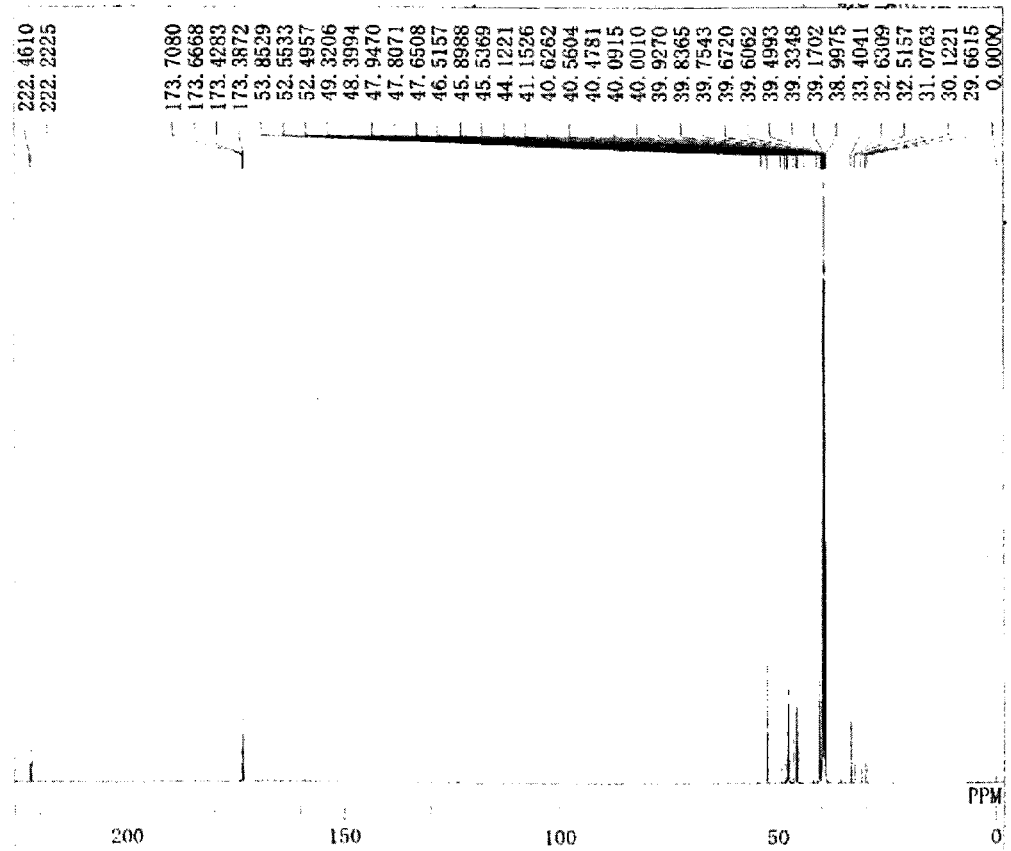

[Fig.4]
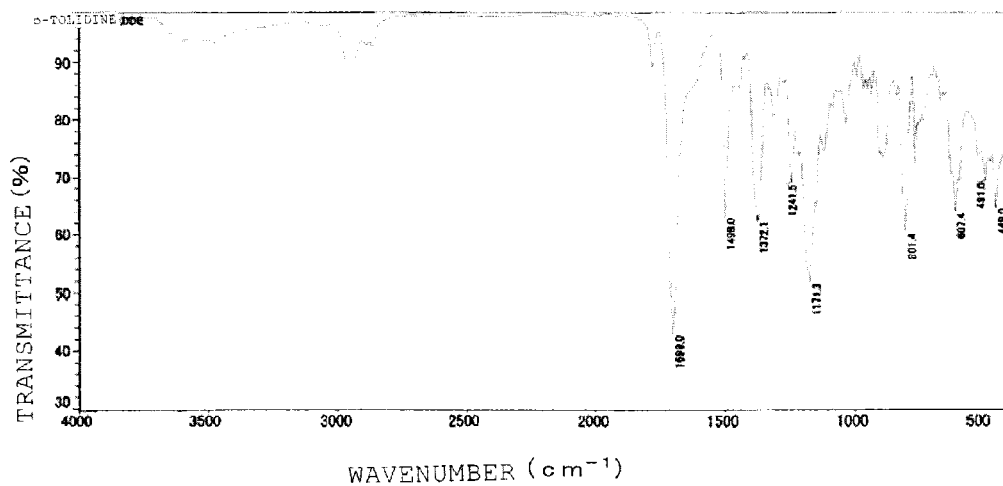
[Fig.5]
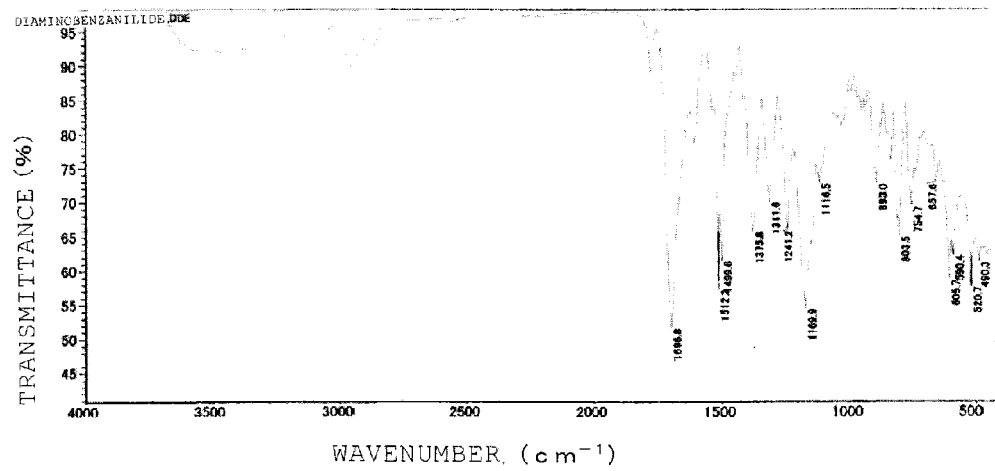

[Fig.6]
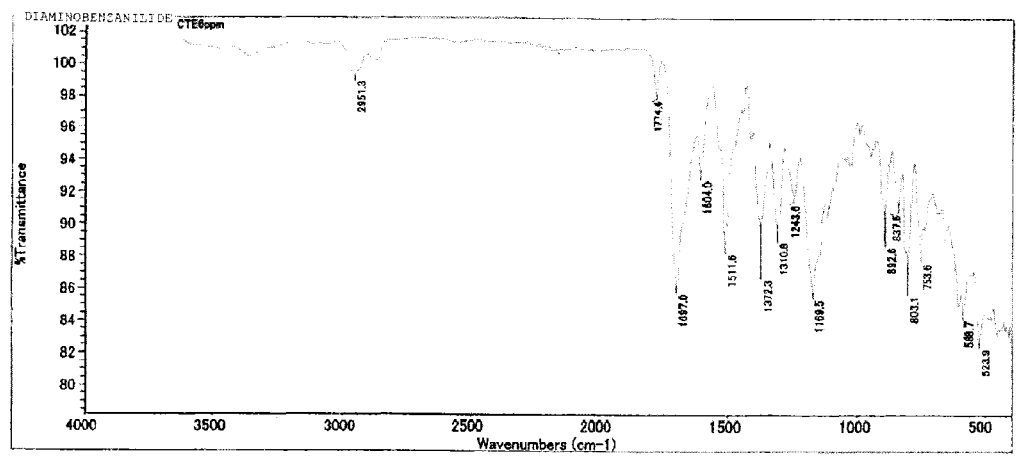
[Fig.7]
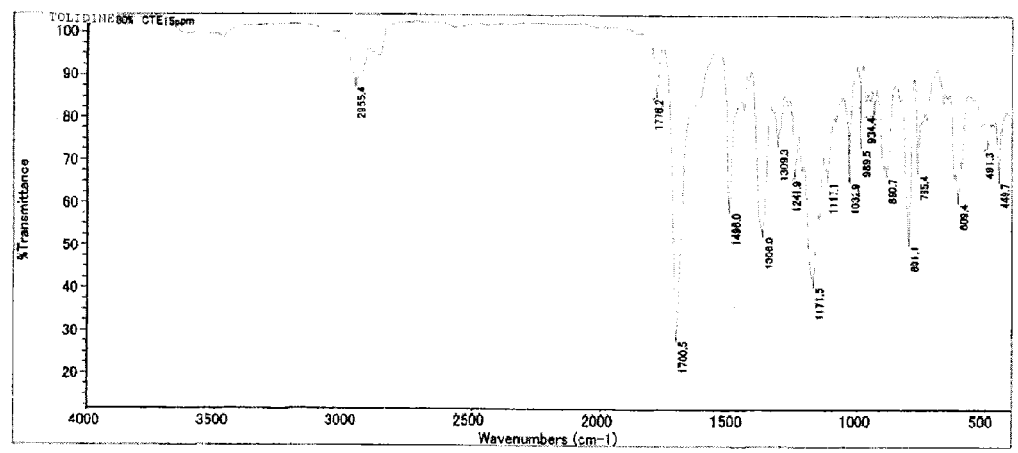

[Fig.8]
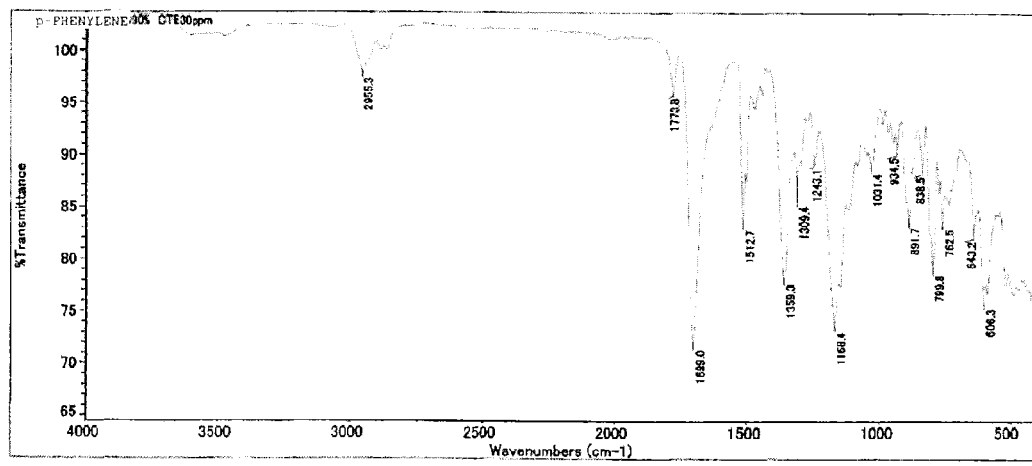
[Fig.9]
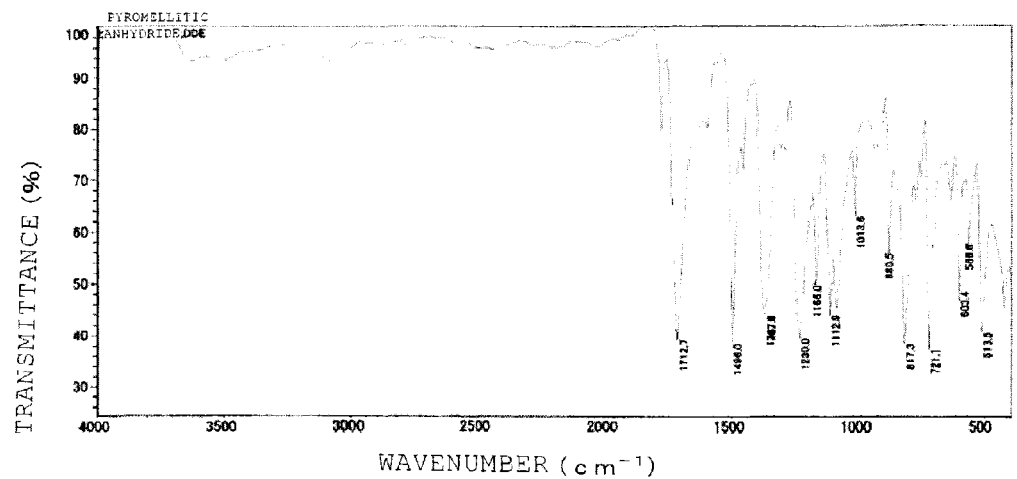

[Fig.10]
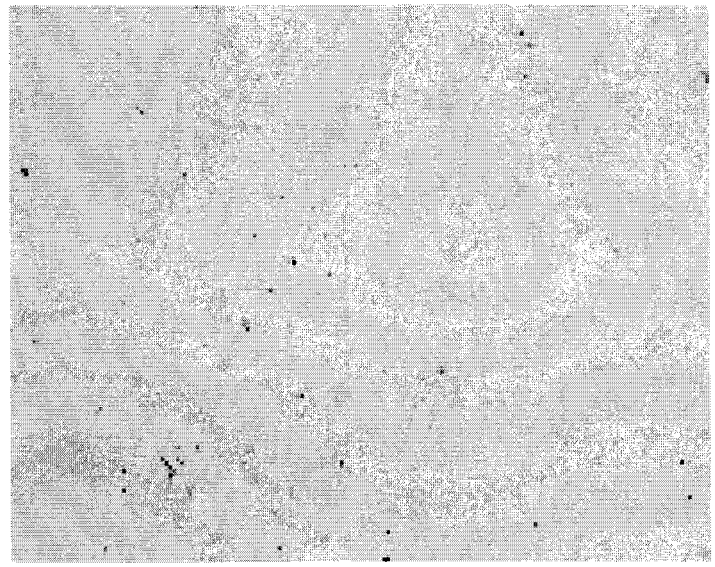
[Fig.11]
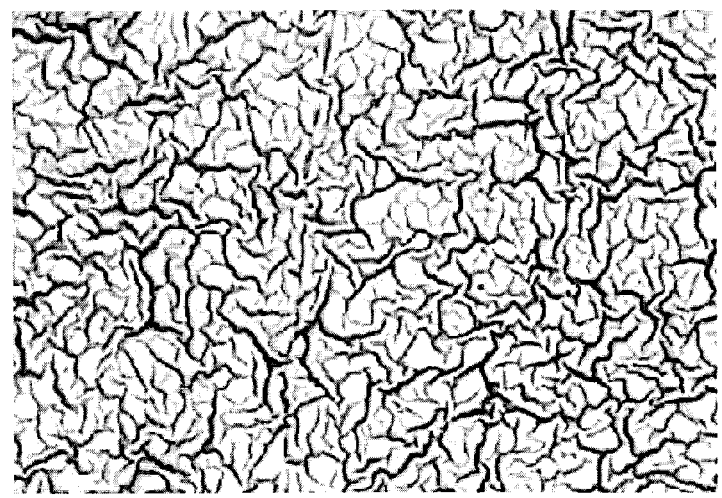

TRANSPARENT FILM, TRANSPARENT ELECTRO-CONDUCTIVE LAMINATE, AND TOUCH PANEL, SOLAR CELL, AND DISPLAY DEVICE USING THE SAME

CROSS-REFERENCE TO RELATED APPLICATIONS

This Application is a U.S. National Stage Application filed under 35 U.S.C. §371 of International Application PCT/JP2012/069840, filed Aug. 3, 2012, designating the United States, which claims priority from Japanese Patent Application 2011-173204, filed Aug. 8, 2011, and Japanese Patent Application 2012-019090, filed Jan. 31, 2012, the complete disclosures of which are hereby incorporated herein by reference in their entirety for all purposes.

TECHNICAL FIELD

The present invention relates to a transparent film, a transparent electro-conductive laminate, and a touch panel, a solar cell, and a display device using the same.

BACKGROUND ART

Polyimide resins have been known so far as resins excellent in heat resistance and dimensional stability. Among the polyimide resins, particularly wholly aromatic polyimide resins, which are obtained by polycondensation reaction between aromatic tetracarboxylic dianhydrides and aromatic diamines, can be used under high-temperature conditions of 400° C. or above, and have excellent dimensional stability with linear expansion coefficients (CTE) of 12 to 32 ppm. Hence, the wholly aromatic polyimide resins have been applied as films, wire coatings, adhesive agents, paints, and the like in various fields mainly including the aviation and aerospace industry, the electronic industry, and the like. However, the wholly aromatic polyimide resins are colored in light yellow to reddish brown, and hence cannot be applied to applications as materials for electron•optical devices and the like which require transparency and the like (for example, materials for substrate films used for transparent electrodes of liquid crystal display devices, organic EL display devices, touch panels, and the like). For this reason, development of aliphatic polyimides excellent in transparency have been advanced, so that such aliphatic polyimides can be applied in applications where transparency is necessary, such as, for example, applications as materials of electron•optical devices and the like. In addition, electro-conductive laminates and the like using substrate films made of aliphatic polyimides have been developed recently. For example, Japanese Unexamined Patent Application Publication No. 2004-111152 (PTL 1) discloses a transparent electro-conductive laminate in which a transparent electro-conductive thin film is stacked on a substrate film made of an aliphatic polyimide containing a repeating unit having an aliphatic group having 4 to 39 carbon atoms.

CITATION LIST

Patent Literature

[PTL 1] Japanese Unexamined Patent Application Publication No. 2004-111152

SUMMARY OF INVENTION

Technical Problem

However, when the transparent electro-conductive laminate as described in PTL 1 is used as an electrode of a solar cell or a liquid crystal display device, fractures (cracks) and the like may be formed, in some cases, in the thin film made of a transparent electro-conductive material in a heating step employed during production of a solar cell or a liquid crystal display device (for example, a process temperature at around 400° C. in a step of forming a TFT [thin film transistor] of a liquid crystal display device). Hence, a solar cell, a liquid crystal display device, or the like cannot necessarily be produced efficiently. Accordingly, conventional transparent electro-conductive laminates as described in PTL 1 do not necessarily have sufficient resistance to heat shock due to heating or the like during production of a solar cell or a liquid crystal display device, and are not necessarily sufficient in terms of heat shock resistance. For this reason, there is a demand for the development of a transparent electro-conductive laminate sufficiently excellent in heat shock resistance and a transparent film which is made of a polyimide having an excellent heat resistance and a sufficiently low linear expansion coefficient and which can be suitably used as a substrate film of such a transparent electro-conductive laminate and the like.

The present invention has been made in view of the problem of the above-described conventional technique, and an object of the present invention is to provide a transparent electro-conductive laminate which has a sufficiently high heat shock resistance and whose quality deterioration can be sufficiently suppressed even under a high-temperature heating condition as employed during production of a solar cell, a liquid crystal display device, or the like, as well as a touch panel, a solar cell, and a display device using the transparent electro-conductive laminate. In addition, another object of the present invention is to provide a transparent film which is made of a polyimide having an excellent heat resistance and a sufficiently low linear expansion coefficient and which can be suitably used as a substrate film of the transparent electro-conductive laminate and the like.

Solution to Problem

The present inventors have conducted earnest study to achieve the above-described objects. As a result, the present inventors have found that when a polyimide containing at least one repeating unit represented by the following general formula (1), having a glass transition temperature of 350° C. to 450° C., and having a linear expansion coefficient of 30 ppm/° C. or less, the linear expansion coefficient being determined by measuring change in length under a nitrogen atmosphere and under a condition of a rate of temperature rise of 5° C./minute in a temperature range from 50° C. to 200° C., is employed as a polyimide in a transparent electro-conductive laminate comprising: a substrate film made of the polyimide; and a thin film made of an electro-conductive material and stacked on the substrate film, the transparent electro-conductive laminate has a sufficiently high heat shock resistance, and quality deterioration thereof can be sufficiently suppressed under a high-temperature heating condition as employed during production of a solar cell, a liquid crystal display device, or the like. This finding has led to the completion of the present invention.

A transparent electro-conductive laminate of the present invention comprises:

a substrate film made of a polyimide; and
a thin film made of an electro-conductive material and stacked on the substrate film, wherein
the polyimide is a polyimide
containing at least one repeating unit represented by the following general formula (1):

[Chem. 1]

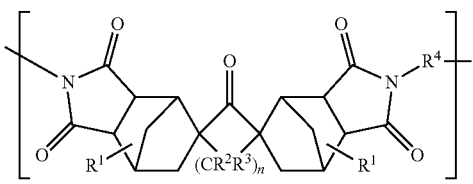
(1)

[in the formula (1), $R^1$, $R^2$, and $R^3$ each independently represent one selected from the group consisting of a hydrogen atom, alkyl groups having 1 to 10 carbon atoms, and a fluorine atom, $R^4$ represents an aryl group having 6 to 40 carbon atoms, and n represents an integer of 0 to 12],
having a glass transition temperature of 350° C. to 450° C., and
having a linear expansion coefficient of 30 ppm/° C. or less, the linear expansion coefficient being determined by measuring change in length under a nitrogen atmosphere and under a condition of a rate of temperature rise of 5° C./minute in a temperature range from 50° C. to 200° C.

In addition, in the transparent electro-conductive laminate of the present invention, $R^4$ in the general formula (1) is preferably one of groups represented by the following general formulae (2) to (5):

[Chem. 2]

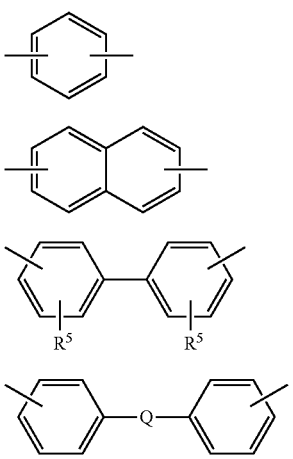

(2)

(3)

(4)

(5)

[in the formula (4), $R^5$ represents one selected from the group consisting of a hydrogen atom, a fluorine atom, a methyl group, an ethyl group, and a trifluoromethyl group, and in the formula (5), Q represents one selected from the group consisting of groups represented by the formulae:
—O—, —S—, —CO—, —CONH—, —$C_6H_4$—, —COO—, —$SO_2$—, —$C(CF_3)_2$—, —$C(CH_3)_2$—, —$CH_2$—, —O—$C_6H_4$—$C(CH_3)_2$—$C_6H_4$—O—, —O—$C_6H_4$—$SO_2$—$C_6H_4$—O—, —$C(CH_3)_2$—$C_6H_4$—$C(CH_3)_2$—, —O—$C_6H_4$—$C_6H_4$—O—, and —O—$C_6H_4$—O—].

Moreover, in the transparent electro-conductive laminate of the present invention, the polyimide preferably contains
a repeating unit which is one group selected from the group consisting of groups represented by the general formula (1), where $R^4$ is represented by the general formula (4); and groups represented by the general formula (1), where $R^4$ is represented by the general formula (5), where Q is one of groups represented by —CONH—, —COO—, —CO—, and —$C_6H_4$—, and
a repeating unit which is one group selected from the group consisting of groups represented by the general formula (1), where $R^4$ is represented by the general formula (2); and groups represented by the general formula (1), where $R^4$ is represented by the general formula (5), where Q is one of groups represented by —O—, —S—, —$CH_2$—, and —O—$C_6H_4$—O—.

Moreover, in the transparent electro-conductive laminate of the present invention, the polyimide more preferably contains
a repeating unit which is one group selected from the group consisting of groups represented by the general formula (1), where $R^4$ is represented by the general formula (4); and groups represented by the general formula (1), where $R^4$ is represented by the general formula (5), where Q is one of groups represented by —CONH— and —COO—, and
a repeating unit which is one group selected from the group consisting of groups represented by the general formula (1), where $R^4$ is represented by the general formula (5), where Q is one of groups represented by —O— and —$CH_2$—.

In addition, a touch panel, a solar cell, and a display device of the present invention each comprise the above-described transparent electro-conductive laminate of the present invention.

Further, a transparent film of the present invention is a transparent film comprising a polyimide
containing at least one repeating unit represented by the following general formula (1):

[Chem. 3]

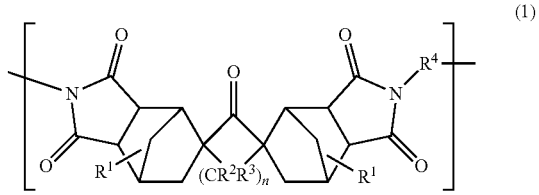
(1)

[in the formula (1), $R^1$, $R^2$, and $R^3$ each independently represent one selected from the group consisting of a hydrogen atom, alkyl groups having 1 to 10 carbon atoms, and a fluorine atom, $R^4$ represents an aryl group having 6 to 40 carbon atoms, and n represents an integer of 0 to 12],
having a glass transition temperature of 350° C. to 450° C., and
having a linear expansion coefficient of 30 ppm/° C. or less, the linear expansion coefficient being determined by measuring change in length under a nitrogen atmosphere and under a condition of a rate of temperature rise of 5° C./minute in a temperature range from 50° C. to 200° C. The transparent film of the present invention can be suitably used as the substrate film of the transparent electro-conductive laminate of the present invention, and the like.

Advantageous Effects of Invention

According to the present invention, it is possible to provide a transparent electro-conductive laminate which has a sufficiently high heat shock resistance and whose quality deterioration can be sufficiently suppressed even under a high-temperature heating condition as employed during production of a solar cell, a liquid crystal display device, or the like, as well as a touch panel, a solar cell, and a display device using the transparent electro-conductive laminate. According to the present invention, it is also possible to provide a transparent film which is made of a polyimide having an excellent heat resistance and a sufficiently low linear expansion coefficient and which can be suitably used as the substrate film of the transparent electro-conductive laminate and the like.

BRIEF DESCRIPTION OF DRAWINGS

FIG. 1 is a graph showing an IR spectrum of norbornane-2-spiro-2'-cyclopentanone-5'-spiro-2''-norbornane-5,5'',6,6''-tetracarboxylic dianhydride obtained in Synthesis Example 1.

FIG. 2 is a graph showing a $^1$H-NMR (DMSO-d$^6$) spectrum of the norbornane-2-spiro-2'-cyclopentanone-5'-spiro-2''-norbornane-5,5'',6,6''-tetracarboxylic dianhydride obtained in Synthesis Example 1.

FIG. 3 is a graph showing a $^{13}$C-NMR (DMSO-d$^6$) spectrum of the norbornane-2-spiro-2'-cyclopentanone-5'-spiro-2''-norbornane-5,5'',6,6''-tetracarboxylic dianhydride obtained in Synthesis Example 1.

FIG. 4 is a graph showing an IR spectrum of a polyimide obtained in Example 1.

FIG. 5 is a graph showing an IR spectrum of a polyimide obtained in Example 2.

FIG. 6 is a graph showing an IR spectrum of a polyimide obtained in Example 3.

FIG. 7 is a graph showing an IR spectrum of a polyimide obtained in Example 4.

FIG. 8 is a graph showing an IR spectrum of a polyimide obtained in Example 5.

FIG. 9 is a graph showing an IR spectrum of a polyimide obtained in Comparative Example 1.

FIG. 10 is a micrograph showing a surface state of a thin film made of ITO in a transparent electro-conductive laminate obtained in Example 1 and subjected to a first heat shock resistance evaluation test (measurement temperature condition: 350° C.).

FIG. 11 is a micrograph showing a surface state of a thin film made of ITO in an electro-conductive laminate obtained in Comparative Example 3 and subjected to a first heat shock resistance evaluation test (measurement temperature condition: 350° C.).

DESCRIPTION OF EMBODIMENTS

Hereinafter, the present invention will be described in detail based on preferred embodiments thereof.

[Transparent Electro-Conductive Laminate]

First, a transparent electro-conductive laminate of the present invention is described. Specifically, the transparent electro-conductive laminate of the present invention comprises:

a substrate film made of a polyimide; and
a thin film made of an electro-conductive material and stacked on the substrate film, wherein
the polyimide is a polyimide
containing at least one repeating unit represented by the following general formula (1):

[Chem. 4]

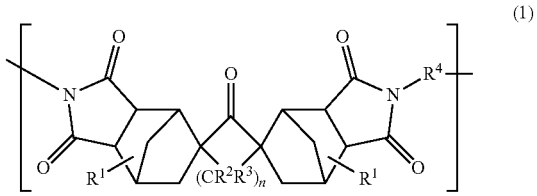

[in the formula (1), $R^1$, $R^2$, and $R^3$ each independently represent one selected from the group consisting of a hydrogen atom, alkyl groups having 1 to 10 carbon atoms, and a fluorine atom, $R^4$ represents an aryl group having 6 to 40 carbon atoms, and n represents an integer of 0 to 12], having a glass transition temperature of 350° C. to 450° C., and having a linear expansion coefficient of 30 ppm/° C. or less, the linear expansion coefficient being determined by measuring change in length under a nitrogen atmosphere and under a condition of a rate of temperature rise of 5° C./minute in a temperature range from 50° C. to 200° C.

<Substrate Film Made of Polyimide>

The polyimide according to the present invention contains at least one repeating unit represented by the above-described general formula (1).

The alkyl group which can be selected as any one of $R^2$, and $R^3$ in the general formula (1) is an alkyl group having 1 to 10 carbon atoms. If the number of carbon atoms exceeds 10, the glass transition temperature is lowered, so that the obtained substrate film cannot have a sufficient heat shock resistance. In addition, the number of carbon atoms of the alkyl group which can be selected as any one of $R^1$, $R^2$, and $R^3$ is preferably 1 to 6, more preferably 1 to 5, further preferably 1 to 4, and particularly preferably 1 to 3, from the viewpoint that the purification becomes easier. In addition, the alkyl group which can be selected as any one of $R^1$, $R^2$, and $R^3$ may be linear or branched. Moreover, the alkyl group is more preferably a methyl group or an ethyl group from the viewpoint of purification.

$R^1$, $R^2$, and $R^3$ in the general formula (1) are more preferably each independently a hydrogen atom or an alkyl group having 1 to 10 carbon atoms, from the viewpoint that a glass transition temperature of 350° C. to 450° C. can be achieved more efficiently in the production of the polyimide, so that a sufficiently high heat resistance can be obtained. In particular, $R^1$, $R^2$, and $R^3$ in the general formula (1) are more preferably each independently a hydrogen atom, a methyl group, an ethyl group, a n-propyl group, or an isopropyl group, and particularly preferably a hydrogen atom or a methyl group, from the viewpoints that the raw materials are readily available, and that the purification is easier. In addition, the plural $R^1$s, $R^2$s, and $R^3$s in the formula are particularly preferably the same, from the viewpoints of ease of purification and the like.

Meanwhile, the aryl group which can be selected as $R^4$ in the general formula (1) is an aryl group having 6 to 40 carbon atoms. In addition, the number of carbon atoms is preferably 6 to 30 and more preferably 12 to 20. If the number of carbon atoms exceeds the upper limit, there is a tendency that a glass transition temperature of 350° C. to 450° C. cannot be achieved, so that a sufficient heat shock resistance cannot be obtained. On the other hand, if the number of carbon atoms is less than the lower limit, there is a tendency that the solubility of the obtained polyimide in a solvent decreases, so that it becomes difficult to form a substrate film.

In addition, from the viewpoints that a sufficiently high glass transition temperature and a sufficiently low linear expansion coefficient are obtained, and these characteristics are exhibited in a well-balanced manner, $R^4$ in the general formula (1) is preferably one of groups represented by the following general formulae (2) to (5):

[Chem. 5]

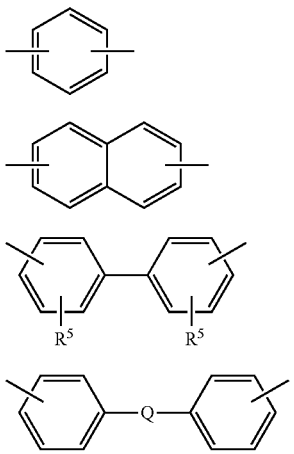

(2)

(3)

(4)

(5)

[in the formula (4), $R^5$ represents one selected from the group consisting of a hydrogen atom, a fluorine atom, a methyl group, an ethyl group, and a trifluoromethyl group, and in the formula (5), Q represents one selected from the group consisting of groups represented by the formulae: —O—, —S—, —CO—, —CONH—, —$C_6H_4$—, —COO—, —$SO_2$—, —C($CF_3$)$_2$—, —C($CH_3$)$_2$—, —$CH_2$—, —O—$C_6H_4$—C($CH_3$)$_2$—$C_6H_4$—O—, —O—$C_6H_4$—$SO_2$—$C_6H_4$—O—, —C($CH_3$)$_2$—$C_6H_4$—C($CH_3$)$_2$—, —O—$C_6H_4$—$C_6H_4$—O—, and —O—$C_6H_4$—O—].

Each $R^5$ in the general formula (4) is more preferably a hydrogen atom, a fluorine atom, a methyl group, or an ethyl group, and particularly preferably a hydrogen atom, from the viewpoint that the glass transition temperature and the linear expansion coefficient are achieved in a well-balanced manner at higher levels.

In addition, Q in the general formula (5) is preferably a group represented by the formula: —O—, —S—, —CONH—, —COO—, —CO—, —$C_6H_4$—, —$CH_2$—, or —O—$C_6H_4$—O—, more preferably a group represented by the formula: —O—, —CONH—, —COO—, or —$CH_2$—, and particularly preferably a group represented by the formula: —O— or —CONH—, from the viewpoint that the glass transition temperature and the linear expansion coefficient are achieved in a well-balanced manner at higher levels.

Moreover, these groups which are represented by the general formulae (2) to (5) and which can be selected as $R^4$ are more preferably the groups represented by the general formulae (4) and (5), from the viewpoints that a sufficiently high glass transition temperature can be achieved, that a sufficiently low value of the linear expansion coefficient can be achieved, that the balance between these characteristics is improved, and that a higher heat shock resistance can be obtained. In particular, from the viewpoints that a lower linear expansion coefficient can be achieved, and a more advanced heat shock resistance can be obtained, $R^4$ is preferably at least one of groups represented by the general formula (4) and groups represented by the general formula (5), where Q is a group represented by —CONH—, —COO—, —CO—, or —$C_6H_4$— (more preferably a group represented by —CONH— or —COO—, and particularly preferably a group represented by —CONH—). Further, from the viewpoint that a higher flexibility can be provided to the obtained substrate film made of a polyimide, $R^4$ is preferably at least one of groups represented by the general formula (2) and groups represented by the general formula (5), where Q is represented by —O—, —S—, —$CH_2$—, or —O—$C_6H_4$—O— (more preferably one of groups represented by —O— and $CH_2$—, and further preferably a group represented by —O—).

In addition, n in the general formula (1) represents an integer of 0 to 12. If the value of n exceeds the upper limit, the purification becomes difficult. In addition, an upper limit value of the numeric value range of n in the general formula (1) is more preferably 5, and particularly preferably 3, from the viewpoint that the purification becomes easier. In addition, a lower limit value of the numeric value range of n in the general formula (1) is more preferably 1, and particularly preferably 2, from the viewpoint of the stability of a raw material of a monomer (for example, a tetracarboxylic dianhydride represented by general formula (6) described later) used for producing the polyimide. Accordingly, n in the general formula (1) is particularly preferably an integer of 2 or 3.

Moreover, the polyimide is preferably a polyimide containing multiple kinds (two or more kinds) of repeating units having different $R^4$s in the general formula (1) from the viewpoint that such a polyimide achieves a sufficiently high glass transition temperature, a sufficiently low linear expansion coefficient, and a sufficient flexibility of the obtained substrate film at higher levels in a well-balanced manner. In addition, from the similar viewpoint, the polyimide containing multiple kinds of repeating units is more preferably a polyimide containing a repeating unit (A) which is one group selected from the group consisting of groups represented by the general formula (1), where $R^4$ is represented by the general formula (4); and groups represented by the general formula (1), where $R^4$ is represented by the general formula (5), where Q is one of groups represented by —CONH—, —COO—, —CO—, and —$C_6H_4$— (more preferably groups represented by —CONH— and —COO—, and particularly preferably a group represented by —CONH—); and a repeating unit (B) which is one group selected from the group consisting of groups represented by the general formula (1), where $R^4$ is represented by the general formula (2); and groups represented by the general formula (1), where $R^4$ is represented by the general formula (5), where Q is one of groups represented by —O—, —S—, —$CH_2$—, and —O—$C_6H_4$—O— (more preferably one of groups represented by —O— and —$CH_2$—, and further preferably a group represented by —O—), because a higher effect can be obtained. In addition, the repeating unit (B) is more preferably one in which $R^4$ in the general formula (1) is a group represented by the general formula (5), where Q is one of groups represented by —O—, —CH$_2$—, and —O—C$_6$H$_4$—O— (more preferably one of groups represented by —O— and —CH$_2$—, and further preferably a group represented by —O—), from the viewpoint of availability of the monomer for the production.

When such repeating units (A) and (B) are contained, a content ratio of the repeating unit (A) and the repeating unit (B) is preferably 9:1 to 6:4 (more preferably 8:2 to 7:3) in terms of the mole ratio ((A):(B)). If the content ratio of the repeating unit (A) is less than the lower limit, it tends to be difficult to obtain a polyimide having a lower linear expansion coefficient. Meanwhile, if the content ratio of the repeating unit (A) exceeds the upper limit, the flexibility of the obtained substrate film tends to decrease. In addition, when the repeating units (A) and (B) are contained, these repeating units (A) and (B) preferably have the same structure in terms of substituents other than R$^4$ in the general formula (1), from the viewpoint that such a polyimide can be prepared more efficiently.

In addition, as described above, R$^4$ in the general formula (1) is particularly preferably a group represented by the general formula (5), where Q is —CONH—, from the viewpoints that a lower linear expansion coefficient can be achieved, and a more advanced heat shock resistance can be obtained. Hence, the polyimide according to the present invention particularly preferably contains a repeating unit which is a group represented by the general formula (1), where R$^4$ is represented by the general formula (5), where Q is a group represented by —CONH— (hereinafter, referred to as "repeating unit (C)" in some cases for convenience) as the repeating unit. Note that when the polyimide contains the repeating unit (C), the content ratio of the repeating unit (C) is preferably 60% by mole or more, more preferably 75% by mole or more, further preferably 90% by mole or more, and particularly preferably 100% by mole, based on the total amount of the repeating units represented by the general formula (1) in the polyimide, because the linear expansion coefficient can be lowered at a higher level (for example, it is also possible to lower the linear expansion coefficient to 20 ppm/° C. or less and further to 10 ppm/° C. or less), while a sufficient heat resistance is retained.

The polyimide according to the present invention has a glass transition temperature of 350° C. to 450° C. If the glass transition temperature is lower than the lower limit, the heat shock resistance of the substrate film is insufficient, so that it is difficult to sufficiently suppress quality deterioration (crack formation and the like) of the transparent electro-conductive laminate in a heating step during production of a solar cell or a liquid crystal display device. Meanwhile, if the glass transition temperature exceeds the upper limit, the resultant film tends to be brittle, because the solid-state polymerization reaction does not proceed sufficiently simultaneously with the thermal ring-closure condensation reaction of the polyamic acid in the production of the polyimide. In addition, from the similar viewpoint, the glass transition temperature of the polyimide is more preferably 360° C. to 420° C., and further preferably 370° C. to 410° C., because a higher effect can be achieved. As the glass transition temperature of the polyimide, a value can be employed which is obtained by using a differential scanning calorimeter (for example, one manufactured by SII NanoTechnology Inc. under the trade name of "DSC7020") as a measuring apparatus and scanning a range between 30° C. and 440° C. under conditions of a rate of temperature rise of 10° C./minute and a rate of temperature drop of 30° C./minute under a nitrogen atmosphere. Note that, for a polyimide having no glass transition temperature between the scan temperatures of 30° C. and 440° C., the glass transition temperature is measured by changing the above-described scan temperature to a range from 30° C. to 470° C.

In addition, the polyimide according to the present invention has a linear expansion coefficient of 30 ppm/° C. or less. If the linear expansion coefficient exceeds the upper limit, a sufficient heat shock resistance cannot be obtained, so that it is difficult to sufficiently suppress quality deterioration because of formation of fractures and the like in the thin film made of the electro-conductive material during production of a solar cell or a liquid crystal display device. In addition, from the similar viewpoint, the linear expansion coefficient is more preferably 25 ppm/° C. or less, and further preferably 20 ppm/° C. or less. In addition, a lower limit value of the linear expansion coefficient is preferably 5 ppm/° C., and more preferably 10 ppm/° C., from the viewpoint of the linear expansion coefficient of the electro-conductive material used for the thin film. In addition, as the linear expansion coefficient of the polyimide, a value which can be obtained as follows can be employed. Specifically, a sample having a size of 20 mm in length, 5 mm in width, and 0.05 mm (50 μm) in thickness is used, and a thermomechanical analyzer (one manufactured by Rigaku Corporation under the trade name of "TMA8310") is used as a measuring apparatus. The change in length of the sample in the longitudinal direction is measured from 50° C. to 200° C. by employing conditions of a tensile mode (49 mN) and a rate of temperature rise of 5° C./minute under a nitrogen atmosphere. Then, an average value of change in length per 1° C. over the temperature range from 50° C. to 200° C. is determined and employed as the linear expansion coefficient. Note that the glass transition temperature and the linear expansion coefficient of the polyimide can be set within the above-described numeric value ranges by changing, as appropriate, the kinds of R$^1$ to R$^4$ in the general formula (1) and the like, and by introducing multiple kinds (two kinds or more) of repeating units represented by the general formula (1). Moreover, the linear expansion coefficient can be finely adjusted to be within the numeric value range by stretching the polyimide film (longitudinal stretching, transversal stretching, oblique stretching, press stretching, or the like), stretching a film of a polyamic acid, which is a precursor of the polyimide, before a heat treatment, or performing a heat treatment on a film of a polyamic acid, which is a precursor of the polyimide, with the polyamic acid film being fixed.

In addition, the polyimide is preferably one having a 5% weight loss temperature of 450° C. or above, and more preferably one having a 5% weight loss temperature of 460° C. to 550° C. If the 5% weight loss temperature is lower than the lower limit, a sufficient heat shock resistance tends not to be obtained. Meanwhile, if the 5% weight loss temperature exceeds the upper limit, it tends to be difficult to produce a polyimide having such a characteristic. Note that the 5% weight loss temperature can be determined by gradually heating a sample from room temperature (25° C.) under a nitrogen gas atmosphere with a nitrogen gas flow and measuring a temperature at which the weight loss of the sample used reaches 5%.

Moreover, regarding the molecular weight of the polyimide, the molecular weight can be evaluated by measurement using an intrinsic viscosity [η] of a polyamic acid, which is a precursor of the polyimide, because a film after thermal imidization may be hardly soluble in commonly used organic solvents. The intrinsic viscosity [η] of the polyamic acid is preferably 0.1 to 8.0, more preferably 0.1 to 6.0, further preferably 0.1 to 3.0, and particularly preferably 0.4 to 2.0. If the intrinsic viscosity is lower than the lower limit, it tends to be difficult to achieve a sufficient heat shock resistance. Meanwhile, if the intrinsic viscosity exceeds the upper limit, it tends to be difficult to cast a film. The intrinsic viscosity [η] can be determined as follows. Specifically, first, by using N,N-dimethylacetamide as a solvent, a measurement sample (solution) is obtained in which the polyamic acid is dissolved in the N,N-dimethylacetamide at a concentration of 0.5 g/dL. Next, by using the measurement sample, the viscosity of the measurement sample is measured with a kinematic viscometer under a temperature condition of 30° C., and the thus determined value is employed as the intrinsic viscosity [η]. Note that an automatic viscometer (trade name: "VMC-252") manufactured by RIGO CO., LTD. is used as the kinematic viscometer.

In addition, the polyimide is more preferably one mainly containing the repeating unit or units represented by the general formula (1) (the total content of the repeating units represented by the general formula (1) is further preferably 50 to 100% by mole and particularly preferably 80 to 100% by mole relative to all the repeating units). As described above, the polyimide may contain other repeating units, as long as the effects of the present invention are not impaired. Note that the other repeating units are not particularly limited, and other repeating units derived from known monomers may be selected and used, as appropriate, depending on the application and the like.

In addition, the shape and size of the substrate film made of the polyimide are not particularly limited, and can be designed as appropriate depending on the application and the like. However, the thickness of the substrate film is preferably 1 to 200 μm, and more preferably 5 to 100 μm. If the thickness of the substrate film is less than the lower limit, the strength of the substrate film tends to be low, because the mechanical strength decreases. Meanwhile, if the thickness of the substrate film exceeds the upper limit, a film formation process tends to be difficult.

In addition, the substrate film made of the polyimide is preferably one having a high transparency, and more preferably one having a total luminous transmittance of 80% or higher (further preferably 85% or higher, and particularly preferably 87% or higher), from the viewpoint of obtaining a transparent electro-conductive laminate having a higher transparency. Such a total luminous transmittance can be easily achieved by selecting, as appropriate, the kind of the polyimide of the substrate film and the like. Note that a value measured by using a measuring apparatus manufactured by NIPPON DENSHOKU INDUSTRIES CO., LTD. under the trade name of "Haze Meter NDH-5000" can be employed as the total luminous transmittance.

Moreover, the substrate film made of the polyimide has a refractive index of preferably 1.50 to 1.70 and more preferably 1.55 to 1.65. If the refractive index is less than the lower limit, the total luminous transmittance tends to decrease because of the large difference in refractive index between the polyimide and the electro-conductive thin film. Meanwhile, if the refractive index exceeds the upper limit, the polyimide tends to be getting colored, and the synthesis of the polyimide itself tends to be difficult. Note that a value measured by using a refractive index-measuring apparatus (manufactured by Atago Co., Ltd. under the trade name of "NAR-1T SOLID") under a light source of 589 nm and a temperature condition of 23° C. can be employed as the refractive index.

Next, a method for producing such a substrate film made of a polyimide is described. The method for producing the substrate film made of the polyimide is not particularly limited, and a method for producing a substrate film shown below can be preferably employed. Specifically, as the method for producing the substrate film, a method for producing a substrate film can be preferably used, the method comprising:

a step (step (I)) of reacting a norbornane-2-spiro-α-cycloalkanone-α'-spiro-2"-norbornane-5,5",6,6"-tetracarboxylic dianhydride with an aromatic diamine in the presence of an organic solvent, to thereby prepare a polyamic acid and obtain a solution of the polyamic acid, the norbornane-2-spiro-α-cycloalkanone-α'-spiro-2"-norbornane-5,5",6,6"-tetracarboxylic dianhydride being represented by the following general formula (6):

[Chem. 6]

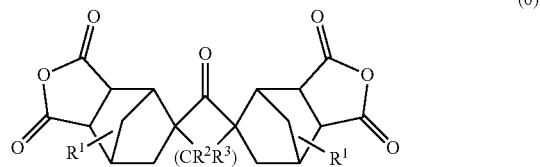

[in the formula (6), $R^1$, $R^2$, and $R^3$ each independently represent one selected from the group consisting of a hydrogen atom, alkyl groups having 1 to 10 carbon atoms, and a fluorine atom, and n represents an integer of 0 to 12], the aromatic diamine being represented by the following general formula (7):

[Chem. 7]

[in the formula (7), $R^4$ represents an aryl group having 6 to 40 carbon atoms], the polyamic acid containing at least one repeating unit represented by the following general formula (8):

[Chem. 8]

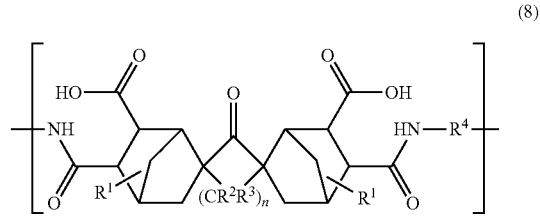

[in the formula (8), $R^1$, $R^2$, and $R^3$ each independently represent one selected from the group consisting of a hydrogen atom, alkyl groups having 1 to 10 carbon atoms, and a fluorine atom, $R^4$ represents an aryl group having 6 to 40 carbon atoms, and n represents an integer of 0 to 12]; and a step (step (II)) of applying the solution of the polyamic acid onto a substrate material and then subjecting the polyamic acid to imidization, to thereby obtain a substrate film made of a polyimide having a repeating unit represented by the general formula (1). The step (I) and the step (II) are described separately below.

(Step (I))

The step (I) is a step of reacting a norbornane-2-spiro-α-cycloalkanone-α'-spiro-2"-norbornane-5,5",6,6"-tetracarboxylic dianhydride represented by the general formula (6) (hereinafter, simply referred to as "compound represented by the general formula (6)" or "tetracarboxylic dianhydride represented by the general formula (6)" depending on the case) with an aromatic diamine represented by the general formula (7) in the presence of an organic solvent, to thereby prepare a polyamic acid having a repeating unit represented by the general formula (8), and obtain a solution of the polyamic acid.

$R^1$, $R^2$, and $R^3$, and n in the general formula (6) are the same as $R^1$, $R^2$, and $R^3$, and n in the general formula (1), and preferred examples thereof are also the same as those of $R^1$, $R^2$, $R^3$, and n in the general formula (1). $R^1$, $R^2$, and $R^3$, and n in the general formula (6) may be changed, as appropriate, depending on the structure of the target polyimide.

Examples of the tetracarboxylic dianhydride represented by the general formula (6) include norbornane-2-spiro-α-cyclopentanone-α'-spiro-2"-norbornane-5,5",6,6"-tetracarboxylic dianhydride (also referred to as "norbornane-2-spiro-2'-cyclopentanone-5'-spiro-2"-nor bornane-5,5",6,6"-tetracarboxylic dianhydride"), methylnorbornane-2-spiro-α-cyclopentanone-α'-spiro-2"-(methylnorbornane)-5,5",6,6"-tetracarboxylic dianhydride, norbornane-2-spiro-α-cyclohexanone-α'-spiro-2"-norbornane-5,5",6,6"-tetracarboxylic dianhydride (also referred to as "norbornane-2-spiro-2'-cyclohexanone-6'-spiro-2"-norbornane-5,5",6,6"-tetracarboxylic dianhydride"), methylnorbornane-2-spiro-α-cyclohexanone-α'-spiro-2"-(methylnorbornane)-5,5",6,6"-tetracarboxylic dianhydride, norbornane-2-spiro-α-cyclopropanone-α'-spiro-2"-norbornane-5,5",6,6"-tetracarboxylic dianhydride, norbornane-2-spiro-α-cyclobutanone-α'-spiro-2"-norbornane-5,5",6,6"-tetracarboxylic dianhydride, norbornane-2-spiro-α-cycloheptanone-α'-spiro-2"-norbornane-5,5",6,6"-tetracarboxylic dianhydride, norbornane-2-spiro-α-cyclooctanone-α'-spiro-2"-norbornane-5,5",6,6"-tetracarboxylic dianhydride, norbornane-2-spiro-α-cyclononanone-α'-spiro-2"-norbornane-5,5",6,6"-tetracarboxylic dianhydride, norbornane-2-spiro-α-cyclodecanone-α'-spiro-2"-norbornane-5,5",6,6"-tetracarboxylic dianhydride, norbornane-2-spiro-α-cycloundecanone-α'-spiro-2"-norbornane-5,5",6,6"-tetracarboxylic dianhydride, norbornane-2-spiro-α-cyclododecanone-α'-spiro-2"-norbornane-5,5",6,6"-tetracarboxylic dianhydride, norbornane-2-spiro-α-cyclotridecanone-α'-spiro-2"-norbornane-5,5",6,6"-tetracarboxylic dianhydride, norbornane-2-spiro-α-cyclotetradecanone-α'-spiro-2"-norbornane-5,5",6,6"-tetracarboxylic dianhydride, norbornane-2-spiro-α-cyclopentadecanone-α'-spiro-2"-norbornane-5,5",6,6"-tetracarboxylic dianhydride, norbornane-2-spiro-α-(methylcyclopentanone)-α'-spiro-2"-norbornane-5,5",6,6"-tetracarboxylic dianhydride, norbornane-2-spiro-α-(methylcyclohexanone)-α'-spiro-2"-norbornane-5,5",6,6"-tetracarboxylic dianhydride, and the like. One of these tetracarboxylic dianhydrides represented by the general formula (6) may be used alone or two or more thereof may be used in combination depending on the specifications of the substrate film made of a polyimide. When multiple kinds of tetracarboxylic dianhydrides represented by the general formula (6) are used, the glass transition temperature and the linear expansion coefficient of the obtained polyimide can be adjusted, as appropriate, to numeric values within the above-described numeric value ranges also by changing the kinds of the tetracarboxylic dianhydrides, as appropriate. Note that a method for producing such a tetracarboxylic dianhydride represented by the general formula (6) will be described later.

In addition, in the diamine compound represented by the general formula (7) and used in the step (I), $R^4$ in the formula (7) is the same as $R^4$ in the general formula (1), and preferred examples thereof are also the same as those of $R^4$ in the general formula (1). $R^4$ in the general formula (7) may be changed, as appropriate, depending on the structure of the target polyimide.

Examples of the aromatic diamine represented by the general formula (7) include 4,4'-diaminodiphenylmethane, 4,4"-diamino-p-terphenyl, 3,3'-diaminodiphenylmethane, 4,4'-diaminodiphenylethane, 3,3'-diaminodiphenylethane, 4,4'-diaminobiphenyl, 3,3'-diaminobiphenyl, 4,4'-diaminodiphenyl ether, 3,3'-diaminodiphenyl ether, 2,2-bis(4-aminophenoxyphenyl)propane, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2'-bis(trifluoromethyl)-4,4'-diaminobiphenyl, 3,4'-diaminodiphenyl ether, 4,4'-diaminobenzophenone, 3,3'-diaminobenzophenone, 9,9-bis(4-aminophenyl)fluorene, p-diaminobenzene (also referred to as p-phenylenediamine), m-diaminobenzene, o-diaminobenzene, 4,4'-diaminobiphenyl, 3,3'-diaminobiphenyl, 2,2'-diaminobiphenyl, 3,4'-diaminobiphenyl, 2,6-diaminonaphthalene, 1,4-diaminonaphthalene, 1,5-diaminonaphthalene, 4,4'-[1,3-phenylenebis(1-methyl-ethylidene)]bisaniline, 4,4'-[1,4-phenylenebis(1-methyl-ethylidene)]bisaniline, 2,2'-dimethyl-4,4'-diaminobiphenyl (also referred to as o-tolidine), 3,3'-dimethyl-4,4'-diaminobiphenyl, 3,3'-diaminodiphenyl sulfone, 4,4'-diaminodiphenyl sulfone, 4,4'-diaminodiphenyl sulfide, 1,4-bis(4-aminophenoxy)benzene, 4,4'-bis(4-aminophenoxy)biphenyl, 4,4'-diaminobenzanilide, 4,4'-diaminophenyl benzoate (also referred to as 4,4'-diaminodiphenyl ester), 9,9'-bis(4-aminophenyl)fluorene, o-tolidine sulfone, 1,3'-bis(4-aminophenoxy)-2,2-dimethylpropane, 2,3,5,6-tetramethyl-1,4-phenylenediamine, 3,3',5,5'-tetramethylbenzidine, 1,5-bis(4-aminophenoxy)pentane, diethyltoluenediamine, aminobenzylamine, bisaniline M, bisaniline P, and the like. A method for producing such an aromatic diamine is not particularly limited, and a known method can be employed, as appropriate. In addition, as the aromatic diamine, a commercially available aromatic diamine can be used as appropriate.

In addition, since the linear expansion coefficient of the obtained polyimide can be adjusted to a lower value within the above-described numeric value, $R^4$ in the aromatic diamine represented by the general formula (7) is more preferably a group represented by the general formula (4) or (5), and particularly preferably a group represented by the general formula (4) or a group represented by the general formula (5), where Q is at least one of groups represented by —CONH—, —COO—, —CO—, and —$C_6H_4$— (more preferably a group represented by —CONH— or —COO—, and particularly preferably a group represented by —CONH—). In addition, from the viewpoint of also providing a higher flexibility to the obtained substrate film made of the polyimide, $R^4$ of the aromatic diamine represented by the general formula (7) is preferably one group selected from the group consisting of groups represented by the general formula (2); and groups represented by the general formula (5), where Q is one of groups represented by —O—, —S—, —$CH_2$—, and —O—$C_6H_4$—O—. In addition, from the viewpoint of availability, $R^4$ in the aromatic diamine represented by the general formula (7) is preferably a group represented by the general formula (5), where Q is one of groups represented by —O—, —$CH_2$—, and —O—$C_6H_4$—O— (more preferably one of groups represented by —O— and —CH$_2$—, and further preferably a group represented by —O—).

Moreover, it is preferable to use, as the aromatic diamine represented by the general formula (7), a combination of multiple kinds (two or more kinds) of aromatic diamines having different kinds of R$^4$ in the general formula (7), from the viewpoint of more reliably preparing a polyimide having a glass transition temperature and a linear expansion coefficient within the above-described numeric value ranges, and being capable of achieving the glass transition temperature, the linear expansion coefficient, and the flexibility of the obtained substrate film at higher levels in a well-balanced manner. In addition, from the similar viewpoint, the multiple kinds (two or more kinds) of aromatic diamines having different kinds of R$^4$ more preferably include at least an aromatic diamine in which R$^4$ in the general formula (7) is one group selected from the group consisting of groups represented by the general formula (4); and groups represented by the general formula (5), where Q is at least one of groups represented by —CONH—, —COO—, —CO—, and —C$_6$H$_4$— (more preferably a group represented by —CONH— or —COO—, particularly preferably a group represented by —CONH—), and an aromatic diamine in which R$^4$ in the general formula (7) is one group selected from the group consisting of groups represented by the general formula (2); and groups represented by the general formula (5), where Q is one of groups represented by —O—, —S—, —CH$_2$—, and —O—C$_6$H$_4$—O— (more preferably one of groups represented by —O— and —CH$_2$—, and further preferably a group represented by —O—), because a higher effect can be obtained.

In addition, the organic solvent used in the step (I) is preferably an organic solvent capable of dissolving both the tetracarboxylic dianhydride represented by the general formula (6) and the aromatic diamine represented by the general formula (7). Examples of the organic solvent include aprotic polar solvents such as N-methyl-2-pyrrolidone, N,N-dimethylacetamide, N,N-dimethylformamide, dimethyl sulfoxide, γ-butyrolactone, propylene carbonate, tetramethylurea, 1,3-dimethyl-2-imidazolidinone, hexamethylphosphoric triamide, and pyridine; phenol-based solvents such as m-cresol, xylenol, phenol, and halogenated phenols; ether-based solvents such as tetrahydrofuran, dioxane, Cellosolve, and glyme; aromatic solvents such as benzene, toluene, xylene, and 2-chloro-4-hydroxytoluene; and the like. One of these organic solvents may be used alone, or two or more thereof may be used as a mixture.

In addition, the ratio between the tetracarboxylic dianhydride represented by the general formula (6) and the aromatic diamine represented by the general formula (7) used in the step (I) is such that the acid anhydride groups of the tetracarboxylic dianhydride represented by the general formula (6) are preferably 0.2 to 2 equivalents, and more preferably 0.3 to 1.2 equivalents, relative to 1 equivalent of the amino groups of the aromatic diamine represented by the general formula (7). If the ratio of the use is less than the lower limit, there is a tendency that the polymerization reaction proceeds inefficiently, so that a polyamic acid having a high molecular weight cannot be obtained. Meanwhile, if the ratio of the use exceeds the upper limit, there is a tendency that a polyamic acid having a high molecular weight cannot be obtained, as in the above-described case.

Moreover, the amount of the organic solvent used in the step (I) is preferably such that a total amount of the tetracarboxylic dianhydride represented by the general formula (6) and the aromatic diamine represented by the general formula (7) can be 0.1 to 50% by mass (more preferably 10 to 30% by mass) relative to the total amount of the reaction solution. If the amount of the organic solvent used is less than the lower limit, there is a tendency that a polyamic acid cannot be obtained efficiently. Meanwhile, if the amount of the organic solvent used exceeds the upper limit, stirring tends to be difficult because of the increased viscosity.

In addition, a basic compound may be further added to the organic solvent in reacting the tetracarboxylic dianhydride represented by the general formula (6) with the aromatic diamine represented by the general formula (7) in the step (I), from the viewpoints of improving the reaction rate, and of obtaining a polyamic acid with a high degree of polymerization. The basic compound is not particularly limited, and examples thereof include triethylamine, tetrabutylamine, tetrahexylamine, 1,8-diazabicyclo[5.4.0]-undecene-7, pyridine, isoquinoline, N-methylpiperidine, α-picoline, and the like. In addition, the amount of the basic compound used is preferably 0.001 to 10 equivalents, and more preferably 0.01 to 0.1 equivalents, relative to 1 equivalent of the tetracarboxylic dianhydride represented by the general formula (6). If the amount of the basic compound used is less than the lower limit, there is a tendency that an effect of the addition is not observed. Meanwhile, if the amount of the basic compound used exceeds the upper limit, coloring and the like tend to be caused.

In addition, a reaction temperature in reacting the tetracarboxylic dianhydride represented by the general formula (6) with the aromatic diamine represented by the general formula (7) in the step (I) may be adjusted as appropriate to a temperature at which these compounds can be reacted with each other. The reaction temperature is not particularly limited, and is set to preferably 80° C. or below, and preferably −30 to 30° C. In addition, a method for reacting the tetracarboxylic dianhydride represented by the general formula (6) with the aromatic diamine represented by the general formula (7) employable in the step (I) is not particularly limited, and a method capable of conducting a polymerization reaction of a tetracarboxylic dianhydride with an aromatic diamine can be used as appropriate. For example, a method may be employed in which the aromatic diamine is dissolved in a solvent under an inert atmosphere of nitrogen, helium, argon, or the like under atmospheric pressure; then the tetracarboxylic dianhydride represented by the general formula (6) is added thereto at the above-described reaction temperature; and then the reaction is allowed to proceed for 10 to 48 hours. If the reaction temperature or the reaction time is less than the lower limit, it tends to be difficult to conduct the reaction sufficiently. Meanwhile, if the reaction temperature or the reaction time exceeds the upper limit, there is a tendency that the possibility of inclusion of a substance (oxygen or the like) which degrades the polymerization product is increased, so that the molecular weight is lowered.

By reacting the tetracarboxylic dianhydride represented by the general formula (6) with the aromatic diamine represented by the general formula (7) as described above, a polyamic acid having at least one repeating unit represented by the general formula (8) can be obtained. In addition, the thus obtained polyamic acid having a repeating unit represented by the general formula (8) may be isolated, and then a solution of the polyamic acid to be used in the step (II) may be prepared by again dissolving the isolated polyamic acid in a solvent (for example, any of the above-described organic solvents or the like). Alternatively, without isolating the polyamic acid having a repeating unit represented by the general formula (8), the reaction liquid obtained by reacting the tetracarboxylic dianhydride represented by the general formula (6) with the aromatic diamine represented by the general formula (7) (the reaction liquid containing the polyamic acid having a repeating unit represented by the general formula (8)) in an organic solvent may be directly used as the solution of a polyamic acid used in the step (II). Note that when the polyamic acid having a repeating unit represented by the general formula (8) is isolated for use from the reaction liquid, the isolation method is not particularly limited. A known method capable of isolating a polyamic acid can be employed as appropriate. For example, a method in which the polyamic acid is isolated as a product of reprecipitation may be employed.

In addition, $R^1$, $R^2$, $R^3$, $R^4$ and n in the general formula (8) are the same as $R^1$, $R^2$, $R^3$, $R^4$ and n in the general formula (1), and preferred examples thereof are also the same as those of $R^1$, $R^2$, $R^3$, $R^4$ and n in the general formula (1).

In addition, the polyamic acid having a repeating unit represented by the general formula (8) has an intrinsic viscosity [η] of preferably 0.1 to 8.0 dL/g, more preferably 0.1 to 6.0 dL/g, further preferably 0.1 to 3.0 dL/g, and particularly preferably 0.4 to 2.0 dL/g. If the intrinsic viscosity [η] is lower than 0.1 dL/g, a film obtained when a film-shaped polyimide is produced by using the polyamic acid tends to be brittle. Meanwhile, if the intrinsic viscosity [η] exceeds 8.0 dL/g, the processability deteriorates because of the excessively high viscosity, so that it becomes difficult to obtain a uniform film when the film is produced from the polyamic acid, for example. In addition, the intrinsic viscosity [η] can be measured as follows. Specifically, first, by using N,N-dimethylacetamide as a solvent, a measurement sample (solution) is obtained in which the polyamic acid is dissolved in the N,N-dimethylacetamide at a concentration of 0.5 g/dL. Next, by using the measurement sample, the viscosity of the measurement sample is measured with a kinematic viscometer under a temperature condition of 30° C., and the thus determined value is employed as the intrinsic viscosity [η]. Note that an automatic viscometer (trade name: "VMC-252") manufactured by RIGO CO., LTD. is used as the kinematic viscometer.

Moreover, when the polyimide obtained by the present invention is one containing another repeating unit in addition to the repeating unit represented by the general formula (1), for example, it is possible to employ, in the step (I), a method in which another tetracarboxylic dianhydride is used together with the tetracarboxylic dianhydride represented by the general formula (6), a method in which another diamine compound is used together with the aromatic diamine represented by the general formula (7), or both of these methods.

Examples of the another tetracarboxylic dianhydride other than the tetracarboxylic dianhydride represented by the general formula (6) include aliphatic or alicyclic tetracarboxylic dianhydrides such as butanetetracarboxylic dianhydride, 1,2,3,4-cyclobutanetetracarboxylic dianhydride, 1,2,3,4-cyclopentanetetracarboxylic dianhydride, 1,2,4,5-cyclohexanetetracarboxylic dianhydride, 2,3,5-tricarboxycyclopentylacetic dianhydride, 3,5,6-tricarboxynorbornane-2-acetic dianhydride, 2,3,4,5-tetrahydrofurantetracarboxylic dianhydride, 1,3,3a,4,5,9b-hexahydro-5-(tetrahydro-2,5-dioxo-3-furanyl)-naphtho[1,2-c]-furan-1,3-dione, 1,3,3a,4,5,9b-hexahydro-5-methyl-5-(tetrahydro-2,5-dioxo-3-furanyl)-naphtho[1,2-c]-furan-1,3-dione, 1,3,3a,4,5,9b-hexahydro-8-methyl-5-(tetrahydro-2,5-dioxo-3-furanyl)-naphtho[1,2-c]-furan-1,3-dione, 5-(2,5-dioxotetrahydrofural)-3-methyl-3-cyclohexene-1,2-dicarboxylic dianhydride, and bicyclo[2,2,2]-oct-7-ene-2,3,5,6-tetracarboxylic dianhydride; aromatic tetracarboxylic dianhydrides such as pyromellitic dianhydride, 3,3',4,4'-benzophenonetetracarboxylic dianhydride, 3,3',4,4'-biphenyl sulfone tetracarboxylic dianhydride, 1,4,5,8-naphthalenetetracarboxylic dianhydride, 2,3,6,7-naphthalenetetracarboxylic dianhydride, 3,3',4,4'-biphenyl ether tetracarboxylic dianhydride, 3,3',4,4'-dimethyldiphenylsilanetetracarboxylic dianhydride, 3,3',4,4'-tetraphenylsilanetetracarboxylic dianhydride, 1,2,3,4-furantetracarboxylic dianhydride, 4,4'-bis(3,4-dicarboxyphenoxy)diphenyl sulfide dianhydride, 4,4'-bis(3,4-dicarboxyphenoxy)diphenyl sulfone dianhydride, 4,4'-bis(3,4-dicarboxyphenoxy)diphenylpropane dianhydride, 3,3',4,4'-perfluoroisopropylidenediphthalic dianhydride, 4,4'-(2,2-hexafluoroisopropylidene)diphthalic dianhydride, 3,3',4,4'-biphenyltetracarboxylic dianhydride, 2,3,3',4'-biphenyltetracarboxylic dianhydride, bis(phthalic acid) phenylphosphine oxide dianhydride, p-phenylene-bis(triphenylphthalic)dianhydride, m-phenylene-bis(triphenylphthalic)dianhydride, bis(triphenylphthalic acid)-4,4'-diphenyl ether dianhydride, and bis(triphenylphthalic acid)-4,4'-diphenylmethane dianhydride; and the like. Note that when an aromatic tetracarboxylic acid is used, the amount of the aromatic tetracarboxylic acid used is preferably changed as appropriate within a range in which the obtained polyimide can have a sufficient transparency, in order to prevent coloring due to the intramolecular CT.

Meanwhile, another diamine compound other than the above-described aromatic diamines is not particularly limited, and a known diamine compound which can be used for production of a polyimide or a polyamic acid can be used as appropriate. For example, aliphatic diamines, alicyclic diamines, and the like can be used as appropriate. Examples of the aliphatic diamines include ethylenediamine, propylenediamine, trimethylenediamine, tetramethylenediamine, hexamethylenediamine, polyoxyalkylenediamine, and the like. Examples of the alicyclic diamines include 4,4'-diamino-dicyclohexylmethane, 3,3'-dimethyl-4,4'-diamino-dicyclohexylmethane, 3,3'-diethyl-4,4'-diamino-dicyclohexylmethane, 3,3',5,5'-tetramethyl-4,4'-diamino-dicyclohexylmethane, 3,3',5,5'-tetraethyl-4,4'-diamino-dicyclohexylmethane, 3,5-diethyl-3',5'-dimethyl-4,4'-diaminodicyclohexylmethane, bis(aminomethyl)cyclohexane, 1,4-diaminocyclohexane, 1,3-diaminocyclohexane, bicyclo[2.2.1]heptanedimethanamine, norbornanediamine, and the like.

Here, a method for producing a tetracarboxylic dianhydride represented by the general formula (6) used in the step (I) is described. The method for producing a tetracarboxylic dianhydride represented by the general formula (6) is not particularly limited, and, for example, a method may be used which comprises converting a 5-norbornene-2-spiro-α-cycloalkanone-α'-spiro-2''-5''-norbornene represented by the following general formula (9) (hereinafter, simply referred to as "compound represented by the general formula (9)" in some cases):

[Chem. 9]

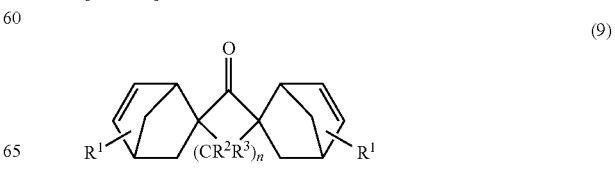

(9)

[in the formula (9), $R^1$, $R^2$, and $R^3$ each independently represent one selected from the group consisting of a hydrogen atom, alkyl groups having 1 to 10 carbon atoms, and a fluorine atom, and n represents an integer of 0 to 12], into a tetracarboxylic dianhydride by using a known method or the like, as appropriate, to thereby obtain the tetracarboxylic dianhydride represented by the general formula (6). The method for converting the compound represented by the general formula (9) into a tetracarboxylic dianhydride is not particularly limited, and a known method can be used as appropriate. For example, a method described in Macromolecules (vol. 27), p. 1117, published in 1994 may be employed. Specifically, as the method for conversion into the tetracarboxylic dianhydride, it is possible to employ a method in which the compound represented by the general formula (9) is converted into a tetraester with carbon monoxide and an alcohol such as methanol in the presence of a Pd catalyst, copper(II) chloride, and sodium acetate, the obtained tetramethyl ester is subjected to a transesterification reaction with formic acid in the presence of an acid catalyst such as p-toluenesulfonic acid, to thereby obtain a tetracarboxylic acid, and then the tetracarboxylic acid is converted into a tetracarboxylic dianhydride with acetic anhydride coexistent in the reaction system of the transesterification reaction, or a method in which after the above-described tetracarboxylic acid is once isolated, and then a thermal dehydration reaction is conducted in an sublimation purification apparatus under a vacuum condition.

In addition, as the method for producing a tetracarboxylic dianhydride represented by the general formula (6), a method may be preferably used which comprises:

a step (first step) of reacting the compound represented by the general formula (9) with an alcohol and carbon monoxide in the presence of a palladium catalyst and an oxidizing agent, to thereby obtain at least one compound of norbornane-2-spiro-α-cycloalkanone-α'-spiro-2''-norbornane-5,5'', 6,6''-tetracarboxylic acids and esters thereof represented by the following general formula (10) (hereinafter, simply referred to as "compounds represented by the general formula (10)" in some cases):

[Chem. 10]

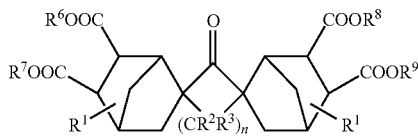

(10)

[in the formula (10), $R^1$, $R^2$, and $R^3$ each independently represent one selected from the group consisting of a hydrogen atom, alkyl groups having 1 to 10 carbon atoms, and a fluorine atom, $R^6$, $R^7$, $R^8$, and $R^9$ each independently represent one selected from the group consisting of a hydrogen atom, alkyl groups having 1 to 10 carbon atoms, cycloalkyl groups having 3 to 10 carbon atoms, alkenyl groups having 2 to 10 carbon atoms, aryl groups having 6 to 20 carbon atoms, and aralkyl groups having 7 to 20 carbon atoms, and n represents an integer of 0 to 12]; and a step (second step) of obtaining, from the compound, a norbornane-2-spiro-α-cycloalkanone-α'-spiro-2''-norbornane-5,5'',6,6''-tetracarboxylic dianhydride represented by the general formula (6) by using a lower carboxylic acid (such as formic acid, acetic acid, or propionic acid), an acid catalyst, and acetic anhydride (hereinafter, this method being referred to as "method (A) for producing a tetracarboxylic dianhydride" in some cases).

In the compound represented by the general formula (9), $R^1$, $R^2$, and $R^3$, and n in the general formula (9) are the same as $R^1$, $R^2$, and $R^3$, and n in the general formula (6), and preferred examples thereof are also the same as those of $R^1$, $R^2$, and $R^3$, and n in the general formula (6).

Here, examples of the compound represented by the general formula (9) include 5-norbornene-2-spiro-α-cyclopentanone-α'-spiro-2''-5''-norbornene (also referred to as "5-norbornene-2-spiro-2'-cyclopentanone-5'-spiro-2''-5''-norbornene"), methyl-5-norbornene-2-spiro-α-cyclopentanone-α'-spiro-2''-(methyl-5''-norbornene), 5-norbornene-2-spiro-α-cyclohexanone-α'-spiro-2''-5''-norbornene (also referred to as "5-norbornene-2-spiro-2'-cyclohexanone-6'-spiro-2''-5''-norbornene"), methyl-5-norbornene-2-spiro-α-cyclohexanone-α'-spiro-2''-(methyl-5''-norbornene), 5-norbornene-2-spiro-α-cyclopropanone-α'-spiro-2''-5''-norbornene, 5-norbornene-2-spiro-α-cyclobutanone-α'-spiro-2''-5''-norbornene, 5-norbornene-2-spiro-α-cycloheptanone-α'-spiro-2''-5''-norbornene, 5-norbornene-2-spiro-α-cyclooctanone-α'-spiro-2''-5''-norbornene, 5-norbornene-2-spiro-α-cyclononanone-α'-spiro-2''-5''-norbornene, 5-norbornene-2-spiro-α-cyclodecanone-α'-spiro-2''-5''-norbornene, 5-norbornene-2-spiro-α-cycloundecanone-α'-spiro-2''-5''-norbornene, 5-norbornene-2-spiro-α-cyclododecanone-α'-spiro-2''-5''-norbornene, 5-norbornene-2-spiro-α-cyclotridecanone-α'-spiro-2''-5''-norbornene, 5-norbornene-2-spiro-α-cyclotetradecanone-α'-spiro-2''-5''-norbornene, 5-norbornene-2-spiro-α-cyclopentadecanone-α'-spiro-2''-5''-norbornene, 5-norbornene-2-spiro-α-(methylcyclopentanone)-α'-spiro-2''-5''-norbornene, 5-norbornene-2-spiro-α-(methylcyclohexanone)-α'-spiro-2''-5''-norbornene, and the like. A method for producing such a compound represented by the general formula (9) is described later.

Meanwhile, in the compound represented by the general formula (10), $R^1$, $R^2$, and $R^3$, and n in the general formula (10) are the same as $R^1$, $R^2$, and $R^3$, and n in the general formula (6), and preferred examples thereof are also the same as those of $R^1$, $R^2$, and $R^3$, and n in the general formula (6).

In addition, regarding the compound represented by the general formula (10), the alkyl group which can be selected as each of $R^6$, $R^7$, $R^8$, and $R^9$ in the general formula (10) is an alkyl group having 1 to 10 carbon atoms. If the number of carbon atoms of the alkyl group exceeds 10, the purification becomes difficult. In addition, the number of carbon atoms of the alkyl group which can be selected as each of $R^6$, $R^7$, $R^8$, and $R^9$ is more preferably 1 to 5 and further preferably 1 to 3, from the viewpoint that the purification becomes easier. In addition, the alkyl group which can be selected as each of $R^6$, $R^7$, $R^8$, and $R^9$ may be linear or branched.

Meanwhile, the cycloalkyl group which can be selected as each of $R^6$, $R^7$, $R^8$, and $R^9$ in the general formula (10) is a cycloalkyl group having 3 to 10 carbon atoms. If the number of carbon atoms of the cycloalkyl group exceeds 10, the purification becomes difficult. In addition, the number of carbon atoms of the cycloalkyl group which can be selected as each of $R^6$, $R^7$, $R^8$, and $R^9$ is more preferably 3 to 8 and further preferably 5 to 6, from the viewpoint that the purification becomes easier.

In addition, the alkenyl group which can be selected as each of $R^6$, $R^7$, $R^8$, and $R^9$ in the general formula (10) is an alkenyl group having 2 to 10 carbon atoms. If the number of carbon atoms of the alkenyl group exceeds 10, the purification becomes difficult. In addition, the number of carbon atoms of the alkenyl group which can be selected as each of $R^6$, $R^7$, $R^8$, and $R^9$ is more preferably 2 to 5 and further preferably 2 to 3, from the viewpoint that the purification becomes easier.

Moreover, the aryl group which can be selected as each of $R^6$, $R^7$, $R^8$, and $R^9$ in the general formula (10) is an aryl group having 6 to 20 carbon atoms. If the number of carbon atoms of the aryl group exceeds 20, the purification becomes difficult. In addition, the number of carbon atoms of the aryl group which can be selected as each of $R^6$, $R^7$, $R^8$, and $R^9$ is more preferably 6 to 10 and further preferably 6 to 8, from the viewpoint that the purification becomes easier.

Meanwhile, the aralkyl group which can be selected as each of $R^6$, $R^7$, $R^8$, and $R^9$ in the general formula (10) is an aralkyl group having 7 to 20 carbon atoms. If the number of carbon atoms of the aralkyl group exceeds 20, the purification becomes difficult. In addition, the number of carbon atoms of the aralkyl group which can be selected as each of $R^7$, $R^8$, and $R^9$ is more preferably 7 to 10 and further preferably 7 to 9, from the viewpoint that the purification becomes easier.

Moreover, $R^6$, $R^7$, $R^8$, and $R^9$ in the general formula (10) are each independently preferably a hydrogen atom, a methyl group, an ethyl group, a n-propyl group, an isopropyl group, a n-butyl group, an isobutyl group, a sec-butyl, a t-butyl, a 2-ethylhexyl group, a cyclohexyl group, an allyl group, a phenyl group, or a benzyl group, and particularly preferably a methyl group, from the viewpoint that the purification becomes easier. Note that $R^6$, $R^7$, $R^8$, and $R^9$ in the general formula (10) may be the same or different, but are more preferably the same from the viewpoint of synthesis.

Examples of the compound represented by the general formula (10) include norbornane-2-spiro-α-cyclopentanone-α'-spiro-2"-norbornane-5,5",6,6"-tetracarboxylic acid tetramethyl ester, norbornane-2-spiro-α-cyclopentanone-α'-spiro-2"-norbornane-5,5",6,6"-tetracarboxylic acid tetraethylester, norbornane-2-spiro-α-cyclopentanone-α'-spiro-2"-norbornane-5,5",6,6"-tetracarboxylic acid tetrapropyl ester, norbornane-2-spiro-α-cyclopentanone-α'-spiro-2"-norbornane-5,5",6,6"-tetracarboxylic acid tetrabutyl ester, norbornane-2-spiro-α-cyclopentanone-α'-spiro-2"-norbornane-5,5",6,6"-tetracarboxylic acid tetra(2-ethylhexyl) ester, norbornane-2-spiro-α-cyclopentanone-α'-spiro-2"-norbornane-5,5",6,6"-tetracarboxylic acid tetraallyl ester, norbornane-2-spiro-α-cyclopentanone-α'-spiro-2"-norbornane-5,5",6,6"-tetracarboxylic acid tetracyclohexyl ester, norbornane-2-spiro-α-cyclopentanone-α'-spiro-2"-norbornane-5,5",6,6"-tetracarboxylic acid tetraphenyl ester, norbornane-2-spiro-α-cyclopentanone-α'-spiro-2"-norbornane-5,5",6,6"-tetracarboxylic acid tetrabenzyl ester, norbornane-2-spiro-α-cyclopentanone-α'-spiro-2"-norbornane-5,5",6,6"-tetracarboxylic acid, methylnorbornane-2-spiro-α-cyclopentanone-α'-spiro-2"-(methylnorbornane)-5,5",6,6"-tetracarboxylic acid tetramethyl ester, norbornane-2-spiro-α-cyclohexanone-α'-spiro-2"-norbornane-5,5",6,6"-tetracarboxylic acid tetramethyl ester, norbornane-2-spiro-α-cyclohexanone-α'-spiro-2"-norbornane-5,5",6,6"-tetracarboxylic acid tetraethyl ester, norbornane-2-spiro-α-cyclohexanone-α'-spiro-2"-norbornane-5,5",6,6"-tetracarboxylic acid tetrapropyl ester, norbornane-2-spiro-α-cyclohexanone-α'-spiro-2"-norbornane-5,5",6,6"-tetracarboxylic acid tetrabutyl ester, norbornane-2-spiro-α-cyclohexanone-α'-spiro-2"-norbornane-5,5",6,6"-tetracarboxylic acid tetra(2-ethylhexyl) ester, norbornane-2-spiro-α-cyclohexanone-α'-spiro-2"-norbornane-5,5",6,6"-tetracarboxylic acid tetraallyl ester, norbornane-2-spiro-α-cyclohexanone-α'-spiro-2"-norbornane-5,5",6,6"-tetracarboxylic acid tetracyclohexyl ester, norbornane-2-spiro-α-cyclohexanone-α'-spiro-2"-norbornane-5,5",6,6"-tetracarboxylic acid tetraphenyl ester, norbornane-2-spiro-α-cyclohexanone-α'-spiro-2"-norbornane-5,5",6,6"-tetracarboxylic acid tetrabenzyl ester, norbornane-2-spiro-α-cyclohexanone-α'-spiro-2"-norbornane-5,5",6,6"-tetracarboxylic acid, methylnorbornane-2-spiro-α-cyclohexanone-α'-spiro-2"-(methylnorbornane)-5,5",6,6"-tetracarboxylic acid tetramethyl ester, norbornane-2-spiro-α-cyclopropanone-α'-spiro-2"-norbornane-5,5",6,6"-tetracarboxylic acid tetramethyl ester, norbornane-2-spiro-α-cyclobutanone-α'-spiro-2"-norbornane-5,5",6,6"-tetracarboxylic acid tetramethyl ester, norbornane-2-spiro-α-cycloheptanone-α'-spiro-2"-norbornane-5,5",6,6"-tetracarboxylic acid tetramethyl ester, norbornane-2-spiro-α-cyclooctanone-α'-spiro-2"-norbornane-5,5",6,6"-tetracarboxylic acid tetramethyl ester, norbornane-2-spiro-α-cyclononanone-α'-spiro-2"-norbornane-5,5",6,6"-tetracarboxylic acid tetramethyl ester, norbornane-2-spiro-α-cyclodecanone-α'-spiro-2"-norbornane-5,5",6,6"-tetracarboxylic acid tetramethyl ester, norbornane-2-spiro-α-cycloundecanone-α'-spiro-2"-norbornane-5,5",6,6"-tetracarboxylic acid tetramethyl ester, norbornane-2-spiro-α-cyclododecanone-α'-spiro-2"-norbornane-5,5",6,6"-tetracarboxylic acid tetramethyl ester, norbornane-2-spiro-α-cyclotridecanone-α'-spiro-2"-nor bornane-5,5",6,6"-tetracarboxylic acid tetramethyl ester, norbornane-2-spiro-α-cyclotetradecanone-α'-spiro-2"-norbornane-5,5",6,6"-tetracarboxylic acid tetramethyl ester, norbornane-2-spiro-α-cyclopentadecanone-α'-spiro-2"-norbornane-5,5",6,6"-tetracarboxylic acid tetramethyl ester, norbornane-2-spiro-α-cyclopentanone-α'-spiro-2"-norbornane-5,5",6,6"-tetracarboxylic acid, norbornane-2-spiro-α-cyclohexanone-α'-spiro-2"-norbornane-5,5",6,6"-tetracarboxylic acid, and the like.

In addition, a method for producing the compound represented by the general formula (9) is not particularly limited, and, for example, a method can be employed in which the compound represented by the general formula (9) is produced by utilizing a reaction represented by the following reaction formula (I):

[Reaction formula (I)]

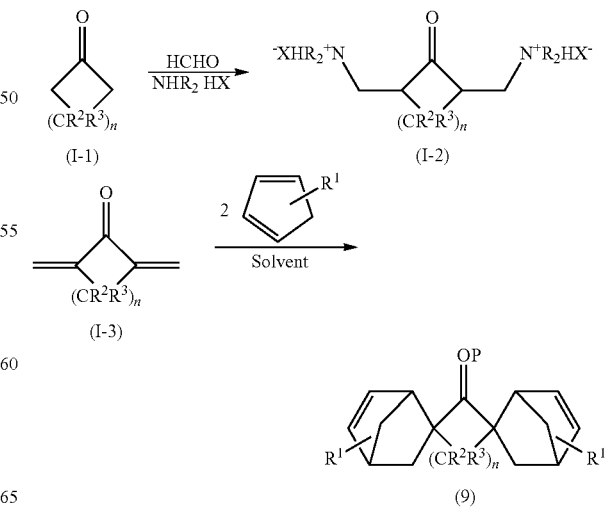

[Chem. 11]

[in the reaction formula (I), $R^1$, $R^2$, and $R^3$, and n have the same meanings as those of $R^1$, $R^2$, and $R^3$, and n in the general formula (6); R independently represents a monovalent organic group (for example, a linear saturated hydrocarbon group having 1 to 20 carbon atoms or the like) capable of forming an amine; $X^-$ represents a monovalent ion (for example, a halogen ion, a hydrogen sulfate ion, an acetate ion, or the like) capable of forming an ammonium salt with an amine]. The method represented by the reaction formula (I) proceeds as follows. Specifically, an acidic reaction liquid is obtained by using a cycloalkanone (cyclopentanone, cyclohexanone, or the like) represented by the general formula (I-1), an ammonium salt of a secondary amine (for example, a hydrochloric acid salt, a sulfuric acid salt, an acetic acid salt, or the like: a compound represented by the formula: $NHR_2HX$ in the reaction formula (I)) in an amount of 2 equivalents or more to the cycloalkanone, a formaldehyde derivative, and an acid (hydrochloric acid, sulfuric acid, acetic acid, or the like). Then, the reaction liquid is heated under an inert gas atmosphere at 30 to 180° C. for 0.5 to 10 hours, to thereby allow a Mannich reaction to proceed among the cyclic ketone having active α-hydrogens at both neighboring positions of the carbonyl group, the formaldehyde, and the secondary amine in the reaction liquid. Thus, the Mannich base represented by the general formula (I-2) is synthesized. Subsequently, a mixture is obtained by adding, to the reaction liquid without isolating the obtained Mannich base, an organic solvent (the organic solvent may be any, as long as the organic solvent can be used for a Diels-Alder reaction, and is preferably an organic solvent such as tetrahydrofuran, methanol, ethanol, isopropanol, butanol, acetonitrile, methyl cellosolve, ethyl cellosolve, ethylene glycol, propylene glycol monomethyl ether, or propylene glycol), and a cyclopentadiene which may have, as a substituent, a group which is the same as that selectable as $R^1$ in the general formula (6) (in an amount of 2 equivalents or more to the Mannich base). Then, the mixture is adjusted to be neutral or basic by introducing a base thereto, and the mixture is stirred for 0.1 to 48 hours under a condition of 0 to 150° C. (preferably about 60° C.). Thus, a divinyl ketone represented by the general formula (I-3) is synthesized in the mixture from the Mannich base represented by the general formula (I-2), and then the divinyl ketone represented by the general formula (I-3) and the cyclopentadiene which may have a substituent are reacted with each other (Diels-Alder reaction). In this manner, the compound represented by the general formula (9) is produced in this method. Note that, as the formaldehyde derivative, any known formaldehyde derivative which is used for producing a Mannich base can be used as appropriate, and, for example, formalin, paraformaldehyde, trioxane, 1,3-dioxolane, or the like can be used as appropriate. In addition, the divinyl ketone is synthesized when an amine compound is eliminated from the Mannich base during the stirring of the mixture under a condition of 0 to 150° C.

In addition, examples of the cycloalkanone represented by the general formula (I-1) in the reaction formula (I) include cyclopropanone, cyclobutanone, cyclopentanone, cyclohexanone, cycloheptanone, cyclooctanone, cyclononanone, cyclodecanone, cycloundecanone, cyclododecanone, cyclotridecanone, cyclotetradecanone, cyclopentadecanone, 3-methylcyclobutanone, 3-methylcyclopentanone, 3-methylcyclohexanone, 3-methylcycloheptanone, 3-methylcyclooctanone, 3-methylcyclononanone, 3-methylcyclodecanone, 3-methylcycloundecanone, 3-methylcyclododecanone, 3-methylcyclotridecanone, 3-methylcyclotetradecanone, 3-methylcyclopentadecanone, and the like. Meanwhile, examples of the ammonium salt of the secondary amine include salts (secondary amine salts in which the above-described $X^-$ serves as a counter anion) of secondary amines such as dimethylamine, diethylamine, di-n-propylamine, diisopropylamine, di-n-butylamine, diisobutylamine, di-sec-butylamine, di-t-butylamine, dipentylamine, dicyclopentylamine, dihexylamine, dicyclohexylamine, diheptylamine, dioctylamine, di(2-ethylhexyl)amine, dinonylamine, didecylamine, diundecylamine, didodecylamine, ditridecylamine, ditetradecylamine, dipentadecylamine, dihexadecylamine, diheptadecylamine, dioctadecylamine, dinonadecylamine, morpholine, diethanolamine, aziridine, azetidine, pyrrolidine, piperidine, indoline, and isoindoline. In addition, $X^-$ in the reaction formula (I) is a so-called counter anion, and examples thereof include $F^-$, $Cl^-$, $Br^-$, $I^-$, $CH_3COO^-$, $CF_3COO^-$, $CH_3SO_3^-$, $CF_3SO_3^-$, $C_6H_5SO_3^-$, $CH_3C_6H_4SO_3^-$, $HOSO_3^-$, $H_2PO_4^-$, and the like. In addition, the divinyl ketone is synthesized when an amine compound is eliminated from the Mannich base during the stirring of the mixture under a condition of 0 to 150° C.

In addition, the alcohol used in the first step of the method (A) for producing a tetracarboxylic dianhydride is preferably an alcohol represented by the following general formula (11):

$$R^{10}OH \quad (11)$$

[in the formula (11), $R^{10}$ is an atom or a group which can be selected as $R^6$, $R^7$, $R^8$, or $R^9$ in the general formula (10), but which is not a hydrogen atom]. Specifically, as the alcohol, an alkyl alcohol having 1 to 10 carbon atoms, a cycloalkyl alcohol having 3 to 10 carbon atoms, an alkenyl alcohol having 2 to 10 carbon atoms, an aryl alcohol having 6 to 20 carbon atoms, or an aralkyl alcohol having 7 to 20 carbon atoms is preferably used. Specific examples of the alcohol include methanol, ethanol, butanol, allyl alcohol, cyclohexanol, benzyl alcohol, and the like. Of these, methanol and ethanol are more preferable, and methanol is particularly preferable, from the viewpoint that it becomes easier to purify the obtained compound. In addition, one of these alcohols may be used alone or two or more thereof may be used as a mixture.

The reaction in the first step using the alcohol is a reaction (esterification reaction) in which the compound represented by the general formula (9) is reacted with the alcohol ($R^{10}OH$) and carbon monoxide (CO) in the presence of a palladium catalyst and an oxidizing agent, and thereby ester groups each represented by the following general formula (12):

$$-COOR^{10} \quad (12)$$

[in the formula (12), $R^{10}$ is an atom or a group which can be selected as $R^6$, $R^7$, $R^8$, or $R^9$ in the general formula (10), but which is not a hydrogen atom]
(in each position in which the ester group is introduced, each of $R^{10}$'s may represent the same or different one) are introduced at olefinic positions in the compound represented by the general formula (9), so that the norbornane-2-spiro-α-cycloalkanone-α'-spiro-2''-norbornane-5,5'',6,6''-tetracarboxylic acid ester represented by the general formula (10) is obtained.

The amount of the alcohol used in the esterification reaction is not particularly limited, as long as the compound represented by the general formula (10) can be obtained. For example, it is possible to add the alcohol in an amount more than the amount (theoretical amount) theoretically necessary to obtain the compound represented by the general formula (10), and use the excessive alcohol as a solvent, as it is.

In addition, in the esterification reaction, the amount of the carbon monoxide is any, as long as a necessary amount of carbon monoxide can be supplied to the reaction system. Accordingly, it is unnecessary to use high-purity carbon monoxide gas as the gas for supplying the carbon monoxide, but it is possible to use a mixture gas obtained by mixing carbon monoxide with an inert gas (for example, nitrogen) for the esterification reaction. It is also possible to use synthetic gas, coal gas, or the like. In addition, the pressure of the carbon monoxide is not particularly limited, and is preferably not lower than normal pressure (approximately 0.1 MPa [1 atm]) but not higher than 10 MPa.

In addition, the palladium catalyst used in the first step is not particularly limited, and a known catalyst containing palladium can be used as appropriate. Examples thereof include palladium inorganic acid salts, palladium organic acid salts, catalysts in which palladium is supported on a support, and the like. Specific examples of the palladium catalyst include palladium chloride, palladium nitrate, palladium sulfate, palladium acetate, palladium acetate trimer, palladium propionate, palladium carbon, palladium alumina, palladium black, various Pd complexes having ligands, and the like. The amount of the palladium catalyst used is preferably set such that the molar amount of palladium in the palladium catalyst can be 0.001 to 0.1 times the molar amount of the compound represented by the general formula (9).

Moreover, the oxidizing agent used in the first step is not particularly limited, as long as the oxidizing agent can oxidize $Pd^0$ to $Pd^{2+}$, when $Pd^{2+}$ in the palladium catalyst is reduced to $Pd^0$ in the esterification reaction. Examples of the oxidizing agent include copper compounds, iron compounds, oxygen, air, hydrogen peroxide, and the like. Specific examples of the oxidizing agent include copper (II) chloride, copper(II) nitrate, copper(II) sulfate, copper(II) acetate, iron(III) chloride, iron(III) nitrate, iron(III) sulfate, iron(III) acetate, manganese dioxide, manganese acetate, and the like. The molar amount of the oxidizing agent used is preferably 2 to 16 times (more preferably about 8 times) the molar amount of the 5-norbornene-2-spiro-α-cycloalkanone-α'-spiro-2''-5''-norbornene represented by the general formula (9).

In addition, it is preferable to use a solvent for the reaction (esterification reaction) of the compound represented by the general formula (9) with the alcohol and carbon monoxide. The solvent is not particularly limited, and examples thereof include hydrocarbon-based solvents such as n-hexane, cyclohexane, heptane, pentane, and toluene.

Moreover, since an acid is by-produced from the oxidizing agent and the like in the esterification reaction, a base may be added to remove the acid. The base is preferably a fatty acid salt such as sodium acetate, sodium propionate, and sodium butyrate. In addition, the amount of the base used may be adjusted as appropriate depending on the amount of the acid generated and the like.

In addition, a reaction temperature condition in the esterification reaction is not particularly limited, and is preferably 0° C. to 100° C. {more preferably about normal temperature (25° C.)}. If the reaction temperature exceeds the upper limit, the yield tends to decrease. Meanwhile, if the reaction temperature is lower than the lower limit, the reaction rate tends to decrease. In addition, a reaction time of the esterification reaction is not particularly limited, and is preferably set to about 30 minutes to 24 hours.

In addition, in order to convert $R^6$, $R^7$, $R^8$, or $R^9$ in the general formula (10) into a hydrogen atom, a hydrolysis treatment or a transesterification reaction with a carboxylic acid may be conducted, after the introduction of the groups represented by the above-described formula: —$COOR^{10}$ by the esterification reaction. A method for the reaction is not particularly limited, and a known method capable of converting the groups represented by the formula: —$COOR^{10}$ into those represented by the formula: —COOH can be employed, as appropriate.

In addition, after the esterification reaction, the hydrolysis or the like is conducted as described above, a purification step such as recrystallization may be conducted as appropriate in order to obtain a compound having a higher purity. A method for the purification is not particularly limited, and a known method can be employed, as appropriate. Thus, the norbornane-2-spiro-α-cycloalkanone-α'-spiro-2''-norbornane-5,5'',6,6''-tetracarboxylic acid ester represented by the general formula (10) of the present invention can be obtained efficiently by the first step.

Subsequently, the second step of the method (A) for producing a tetracarboxylic dianhydride is described. The second step is a step of obtaining a norbornane-2-spiro-α-cycloalkanone-α'-spiro-2''-norbornane-5,5'',6,6''-tetracarboxylic dianhydride represented by the general formula (6) from at least one compound of the norbornane-2-spiro-α-cycloalkanone-α'-spiro-2''-norbornane-5,5'',6,6''-tetracarboxylic acids and esters thereof by using a lower carboxylic acid (formic acid, acetic acid, propionic acid, or the like), an acid catalyst, and acetic anhydride.

The acid catalyst used in the second step is not particularly limited, and is preferably p-toluene sulfonic acid, benzenesulfonic acid, hydrochloric acid, nitric acid, sulfuric acid, phosphoric acid, methanesulfonic acid, trifluoroacetic acid, Amberlyst, or Amberlite, and more preferably p-toluenesulfonic acid, from the viewpoint of acid strength. The molar amount of the acid catalyst used in the second step is preferably 0.01 to 0.2 times the molar amount of the compound represented by the general formula (10). If the amount of the acid catalyst used is less than the lower limit, the reaction rate tends to decrease. Meanwhile, if the amount of the acid catalyst exceeds the upper limit, the yield tends to decrease.

In addition, the amount of the lower carboxylic acid (for example, formic acid, acetic acid, or propionic acid) used in the second step is not particularly limited, and the molar amount of the lower carboxylic acid is preferably 4 to 100 times the molar amount of the compound represented by the general formula (10). If the amount of the lower carboxylic acid (formic acid, acetic acid, propionic acid, or the like) used is less than the lower limit, the reaction rate tends to decrease. Meanwhile, if the amount of the lower carboxylic acid exceeds the upper limit, the yield tends to decrease.

Moreover, the amount of acetic anhydride used in the second step is not particularly limited, and the molar amount of the acetic anhydride is preferably 4 to 100 times the molar amount of the compound represented by the general formula (10). If the amount of the acetic anhydride used is less than the lower limit, the reaction rate tends to decrease. Meanwhile, if the amount of the acetic anhydride exceeds the upper limit, the yield tends to decrease.

In addition, the second step is not particularly limited, but preferably comprises the following steps (A) to (C), for example. Specifically, the second step preferably comprises: a step (A) of preparing a mixture liquid of the compound represented by the general formula (10) with the lower carboxylic acid (formic acid, acetic acid, propionic acid, or the like) and the acid catalyst, and heating the mixture liquid under reflux; a step (B) of obtaining a liquid concentrate by concentrating the mixture liquid by partially evaporating liquid in the mixture liquid under reduced pressure, adding again the lower carboxylic acid (formic acid or the like) to the obtained liquid concentrate, and heating the mixture under reflux, and then concentrating again the obtained mixture liquid by partially evaporating liquid under reduced pressure; and a step (C) of adding the lower carboxylic acid (formic acid, acetic acid, propionic acid, or the like) and acetic anhydride to the liquid concentrate, and heating the mixture under reflux, to thereby obtain a compound represented by the general formula (6). The employment of this method makes it possible to more efficiently obtain the compound represented by the general formula (6) from the compound represented by the general formula (10).

In addition, when such a method is employed, the step of performing the addition of the lower carboxylic acid such as formic acid, acetic acid, or propionic acid to the liquid concentrate and the concentrating of the liquid concentrate is preferably conducted repeatedly (preferably conducted 1 to 5 times repeatedly) in the step (B). Alternatively, it is also preferable to evaporate the produced carboxylic acid methyl ester and water with the lower carboxylic acid, and then continuously add the lower carboxylic acid in an amount equivalent to that reduced by the evaporation in the step (B). By repeatedly conducting the step of performing the addition of the lower carboxylic acid such as formic acid, acetic acid, or propionic acid to the liquid concentrate and the concentrating of the liquid concentrate in the step (B), a tetraester can be completely converted into a tetracarboxylic acid, when any one of $R^6$, $R^7$, $R^8$, and $R^9$ in the general formula (10) is a group other than a hydrogen atom, and the compound represented by the general formula (6) can be obtained more efficiently in the step (C) conducted after the step (B). In addition, the molar amount of the lower carboxylic acid (formic acid, acetic acid, propionic acid, or the like) used in the production of the mixture liquid in the step (A) is preferably about 50 times the molar amount of the compound represented by the general formula (10). In addition, the amount of the lower carboxylic acid (formic acid or the like) added to the liquid concentrate in each of the steps (B) and (C) is preferably approximately equal to the amount of the liquid evaporated during the concentration.

In addition, a method for the concentration (evaporation under reduced pressure) of the mixture liquid in the step (B) is not particularly limited, and a known method can be employed as appropriate. In addition, a temperature condition of the heating under reflux in each of the steps (A) to (C) is preferably 100° C. to 180° C. and more preferably 100° C. to 140° C. If the temperature of the heating under reflux is lower than the lower limit, the yield tends to decrease. Meanwhile, if the temperature exceeds the upper limit, by-products tend to increase, and the transparency tends to decrease because of coloring. In addition, a time of the heating under reflux is preferably set to about 30 minutes to 24 hours.

Moreover, after a crude product of the compound represented by the general formula (6) is obtained from the compound represented by the general formula (10) in the second step, the crude product may be subjected to a purification step such as recrystallization or sublimation, as appropriate. The purification step makes it possible to obtain the compound represented by the general formula (6) having a higher purity. A method for the purification is not particularly limited, and a known method can be employed, as appropriate. Note that when a solid acid such as Amberlite is used as the acid catalyst, purification by recrystallization can be conducted simultaneously with concentration by removing the acid catalyst only by filtration, and concentrating the obtained filtrate.

By conducting the second step as described above, the norbornane-2-spiro-α-cycloalkanone-α'-spiro-2"-norbornane-5,5",6,6"-tetracarboxylic dianhydride represented by the general formula (6) of the present invention can be obtained in a high yield.

Moreover, another preferred method for producing the tetracarboxylic dianhydride represented by the general formula (6) is as follows. Specifically, after a norbornane-2-Spiro-α-cycloalkanone-α'-spiro-2"-norbornane-5,5",6,6"-tetracarboxylic acid ester represented by the general formula (10) is obtained by conducting the first step, the norbornane-2-spiro-α-cycloalkanone-α'-spiro-2"-norbornane-5,5",6,6"-tetracarboxylic acid ester is hydrolyzed in the presence of an acid catalyst or a base catalyst, to thereby produce the norbornane-2-spiro-α-cycloalkanone-α'-spiro-2"-norbornane-5,5",6,6"-tetracarboxylic acid. After that, the obtained norbornane-2-spiro-α-cycloalkanone-α'-spiro-2"-norbornane-5,5",6,6"-tetracarboxylic acid is subjected to dehydrating ring closure by heating or by use of a dehydrating agent, to thereby produce the norbornane-2-spiro-α-cycloalkanone-α'-spiro-2"-norbornane-5,5",6,6"-tetracarboxylic dianhydride represented by the general formula (6).

(Step (II))

Next, the step (II) is described. The step (II) is a step (step (II)) of applying the solution of the polyamic acid having a repeating unit represented by the general formula (8) and obtained in the step (I) onto a substrate material, and then subjecting the polyamic acid to imidization, to thereby obtain a substrate film made of a polyimide having a repeating unit represented by the general formula (1).

The substrate material onto which the solution of the polyamic acid is applied is not particularly limited, and a substrate material (for example, a glass plate or a metal plate) made of a known material which can be used for forming a substrate film made of a polymer can be used, as appropriate, according to the shape of the desired substrate film made of a polyimide and the like.

In addition, a method for applying the solution of the polyamic acid onto the substrate material is not particularly limited, and a known method such as a spin coating method, a spray coating method, a dip coating method, a dropping method, a gravure printing method, a screen printing method, a relief printing method, a die coating method, a curtain coating method, or an inkjet method can be employed as appropriate, for example.

In addition, regarding the thickness of the coating film of the polyamic acid formed on the substrate material, the thickness of the coating film after drying is preferably 1 to 200 μm and more preferably 5 to 100 μm. If the thickness is less than the lower limit, the strength of the substrate film tends to be low, because the mechanical strength decreases. Meanwhile, if the thickness exceeds the upper limit, the film formation process tends to be difficult.

In addition, it is preferable to conduct a drying treatment after the coating film is formed by applying the solution of the polyamic acid onto the substrate material. A temperature condition in a method for the drying treatment is preferably 0 to 100° C. and more preferably 20 to 80° C. If the temperature condition in the drying treatment is lower than the lower limit, there is a tendency that the solvent is not removed by the drying. Meanwhile, if the temperature condition exceeds the upper limit, there is a tendency that the solvent boils, so that the film contains babbles and voids.

In addition, an atmosphere in the method for the drying treatment is preferably an inert gas atmosphere (for example, a nitrogen atmosphere). A pressure condition in the drying treatment is preferably 1 to 200 mmHg, from the viewpoint of carrying out the drying more efficiently. Such a drying treatment enables isolation of the polyamic acid having a repeating unit represented by the general formula (8) in the form of a film or the like, a subsequent heat treatment, and the like.

Moreover, a method for the imidization of the polyamic acid is not particularly limited, as long as the polyamic acid can be subjected to imidization by this method, and a known method can be employed as appropriate. For example, it is preferable to employ a method in which the polyamic acid having a repeating unit represented by the general formula (8) is subjected to imidization by performing a heat treatment thereon for dehydration reaction, or a method in which the imidization is conducted by using a so-called "imidization agent."

When a dehydration reaction by performing a heat treatment is conducted as a method for the imidization of the polyamic acid as described above, the heat treatment is preferably conducted at a temperature condition of 200 to 450° C. (preferably 250 to 440° C., more preferably 300 to 430° C., further preferably 350 to 420° C., and particularly preferably 360° C. to 410° C.). If the heating temperature is lower than 200° C. in a case where the imidization method by conducting the heat treatment and thereby performing the dehydration reaction is employed, the equilibrium tends to favor the reaction in which the polyamic acid is decomposed to the acid dianhydride and the amine over the reaction in which the polyamic acid is converted into the polyimide by dehydrating ring closure. Meanwhile, if the heating temperature exceeds the upper limit, coloring, decrease in molecular weight due to thermal decomposition, or the like tends to occur.

In addition, when the method for performing the imidization by performing the heat treatment is employed, the following method is preferably employed. Specifically, as the solution of the polyamic acid, the reaction liquid (the reaction liquid containing the polyamic acid having a repeating unit represented by the general formula (8)) obtained by reacting the tetracarboxylic dianhydride represented by the general formula (6) with the aromatic diamine represented by the general formula (7) in the organic solvent in the step (I) is used as it is without isolating the polyamic acid having a repeating unit represented by the general formula (8). The solution of the polyamic acid (the reaction liquid) is subjected to the above-described drying treatment to thereby remove the solvent, and then to a heat treatment in the above-described temperature range for the imidization. This method in which the reaction liquid obtained in the step (I) is, as it is, applied onto the substrate material (for example, a glass plate), and the drying treatment and the heat treatment are conducted as described above makes it possible to produce the substrate film made of the polyimide by a simple method.

Meanwhile, when a method for performing the imidization by using a so-called "imidization agent" is employed, the imidization is preferably conducted in the presence of the imidization agent in the solution of the polyamic acid having a repeating unit represented by the general formula (8). As the solvent of the solution, the organic solvents described for the step (I) can be used preferably. For this reason, when the method for performing the imidization by using an imidization agent is employed, it is more preferable to employ a method in which the reaction liquid (the reaction liquid containing the polyamic acid having a repeating unit represented by the general formula (8)) obtained by reacting the tetracarboxylic dianhydride represented by the general formula (6) with the aromatic diamine represented by the general formula (7) in an organic solvent is used as the solution of the polyamic acid, as it is, without isolating the polyamic acid having a repeating unit represented by the general formula (8), and the imidization is conducted by adding an imidization agent to the solution of the polyamic acid (reaction liquid).

As the imidization agent, a known imidization agent can be used as appropriate, and examples thereof include acid anhydrides such as acetic anhydride, propionic anhydride, and trifluoroacetic anhydride; tertiary amines such as pyridine, collidine, lutidine, triethylamine, N-methylpiperidine, and β-picoline; and the like.

In addition, a reaction temperature of the imidization in a case where the imidization is conducted by adding the imidization agent is preferably 0 to 180° C. and more preferably 60 to 150° C. In addition, the reaction time is preferably 0.1 to 48 hours. If the reaction temperature or the reaction time is less than the lower limit, it tends to be difficult to perform the imidization sufficiently. Meanwhile, if the reaction temperature or the reaction time exceeds the upper limit, there is a tendency that the possibility of inclusion of a substance (oxygen or the like) which degrades the polymerization product is increased, so that the molecular weight is lowered. In addition, the amount of the imidization agent used is not particularly limited, and may be set to several millimoles to several moles (preferably about 0.05 to 1.0 mol) relative to 1 mol of the repeating unit represented by the general formula (8) in the polyamic acid.

A polyimide containing at least one repeating unit represented by the above-described general formula (1) can be obtained by performing imidization of the polyamic acid as described above. Then, as a method for obtaining such a substrate film made of a polyimide, it is possible to employ the following method (a) or method (b). Specifically, in the method (a), the substrate film made of the polyimide having a repeating unit represented by the general formula (1) is obtained by directly thermally curing the polyamic acid obtained as a dry coating film on the substrate material as described above. In the method (b), the substrate film made of the polyimide having a repeating unit represented by the general formula (1) is obtained by using the polyimide obtained as a dry coating film on the substrate material as described above or the polyimide solution obtained by the imidization by adding the imidization agent as described above, adding the polyimide or the polyimide solution to a poor solvent of the polyimide, isolating the polyimide containing a repeating unit represented by the general formula (1) by conducting filtration, washing, drying, or the like, as appropriate, dissolving the isolated polyimide in an organic solvent to prepare of a solution of the polyimide, applying the solution of the polyimide onto the substrate material, drying the coating film, and thermally curing the dry coating film of the polyimide containing a repeating unit represented by the general formula (1).

A method for thermally curing the dry coating film of the polyimide employed in the methods (a) and (b) is not particularly limited, and it is preferable to employ a method in which the dry coating film is heated at a temperature around the glass transition temperature of the polyimide (more preferably at the glass transition temperature±40° C., further preferably at the glass transition temperature±20° C., and particularly preferably at the glass transition temperature±10° C.) for 0.1 to 10 hours (preferably 0.5 to 2 hours).

If the heating temperature or the heating time is lower or less than the lower limit, there is a tendency that the solid-state polymerization reaction does not proceed sufficiently, so that the resultant film is brittle and weak. Meanwhile, if the heating temperature or the heating time exceeds the upper limit, coloring, decrease in molecular weight due to thermal decomposition, or the like tends to occur. In addition, an atmosphere during the thermal curing of the dry coating film is preferably an inert gas atmosphere (for example, a nitrogen atmosphere), and a pressure condition during the thermal curing is preferably 0.01 to 760 mmHg and more preferably 0.01 to 200 mmHg. Note that when the method (a) is employed, the heat treatment for the imidization and the heat treatment for the subsequent thermal curing may be conducted at once as a serial heat treatment. In such a case, it is preferable to continuously conduct the heat treatment at a constant temperature by employing a temperature within the temperature range employed in the thermal curing as the heating temperature for the imidization. In other words, when the method (a) is employed, it is possible to obtain the substrate film by the serial heat treatment (the imidization and the thermal curing are conducted by a single heat treatment) in which the coating film is cured directly after the imidization.

In addition, the poor solvent of the polyimide used for isolating the polyimide containing a repeating unit represented by the general formula (1) in the method (b) is not particularly limited, and methanol, ethanol, isopropanol, acetone, ethyl acetate, hexane, toluene, or the like can be used, for example. In addition, as the solvent of the polyimide solution in the method (b), the same solvents as those described for the solution of the polyamic acid can be used. Moreover, as the method for drying the coating film of the polyimide solution employed in the method (b), the same method as the method for performing a drying treatment on the coating film of the solution of the polyamic acid described above can be employed.

By conducting the above-described step (I) and step (II) as described above, it is possible to obtain a substrate film made of a polyimide containing at least one repeating unit represented by the above-described general formula (1) and having a glass transition temperature of 350° C. to 450° C. and a linear expansion coefficient of 30 ppm/° C. or less. The thus obtained substrate film made of the polyimide has a sufficiently high heat resistance and a sufficiently low linear expansion coefficient, and hence has a sufficiently high resistance to heat shock (change in surrounding temperature).

<Thin Film Made of Electro-Conductive Material>

A thin film made of an electro-conductive material according to the present invention is one stacked on the substrate film made of the polyimide.

The electro-conductive material is not particularly limited, as long as the material has electroconductivity. Known electro-conductive materials which can be used for transparent electrodes of solar cells, organic EL elements, or liquid crystal display devices, or the like can be used as appropriate, and examples thereof include metals such as gold, silver, chromium, copper, and tungsten; composite materials of metal oxides of tin, indium, zinc, cadmium, titanium, and the like doped with other elements (for example, tin, tellurium, cadmium, molybdenum, tungsten, fluorine, zinc, germanium, aluminum, and the like) (for example, indium tin oxide (ITO ($In_2O_3$:Sn)), fluorine-doped tin oxide (FTO ($SnO_2$:F)), aluminum-doped zinc oxide (AZO (ZnO:Al)), indium-doped zinc oxide (IZO (ZnO:I)), germanium-doped zinc oxide (GZO(ZnO:Ge)), and the like); and the like. In addition, of these electro-conductive materials, ITO (particularly preferably ITO containing 3 to 15% by mass of tin) is preferably used, because the transparency and the electro-conductive can be exhibited at higher levels in a well-balanced manner.

A film thickness design of the thin film made of the electro-conductive material (electro-conductive thin film) can be changed as appropriate depending on the application and the like, and the film thickness is not particularly limited. The film thickness is preferably 1 nm to 2000 nm, more preferably 10 nm to 1000 nm, further preferably 20 nm to 500 nm, and particularly preferably 20 nm to 200 nm. If the thickness of the electro-conductive thin film is less than the lower limit, there is a tendency that the surface resistance value is not sufficiently lowered, so that the photoelectric conversion efficiency decreases in a case of use for a solar cell or the like. Meanwhile, if the thickness of the electro-conductive thin film exceeds the upper limit, the transmittance tends to decrease, and the production efficiency tends to decrease because of long film formation time.

A method for stacking the thin film made of the electro-conductive material on the substrate film is not particularly limited, and a known method can be used as appropriate. For example, it is possible to employ a method in which the thin film is stacked on the substrate film by forming a thin film of the electro-conductive material on the substrate film by a vapor deposition method such as a sputtering method, a vacuum vapor deposition method, an ion plating method, or a plasma CVD method. Note that, when the thin film is stacked on the substrate film, a gas barrier film may be formed on the substrate film in advance, and the thin film may be stacked on the substrate film with the gas barrier film interposed therebetween. In addition, the gas barrier film is not particularly limited, and a known film which can be used for a transparent electrode of a solar cell, an organic EL element, or a liquid crystal display device, or the like can be used as appropriate. In addition, as the method for forming the gas barrier film, a known method can be used as appropriate.

In addition, since the substrate film is made of the polyimide having a glass transition temperature of 350° C. to 450° C. and a linear expansion coefficient of 30 ppm/° C. or less in the present invention, the heat resistance and the linear expansion coefficient are balanced very well. Hence, even when the thin film is produced by using an existing sputtering apparatus for producing an ITO glass substrate or the like (for example, when the thin film is produced by using an existing sputtering apparatus for producing an ITO glass substrate used in an electron-beam heating vacuum vapor deposition method, a DC magnetron sputtering method, or the like and by employing an ordinary temperature condition (for example, 250 to 350° C.) during formation of the thin film), no fractures (cracks) are formed in the obtained thin film made of the electro-conductive material, and an electro-conductive laminate with sufficiently high quality can be obtained. Thus, the transparent electro-conductive laminate of the present invention does not necessarily require the use of a special and damage-free sputtering apparatus such as an apparatus used for forming a metal thin film on a plastic substrate such as a PET film by a low-energy ion plating method, high magnetic field application, an RF-superimposed DC magnetron sputtering method, or the like. Accordingly, the transparent electro-conductive laminate can be produced also by using existing facilities which can be used for producing a metal thin film on a glass substrate and by using the substrate film made of the polyimide as a substitute for the glass substrate. Hence, it can be said that the transparent electro-conductive laminate is very useful, for example, from the viewpoint of the production costs including plant investment and the like. Moreover, when a metal thin film of ITO or the like is formed on a plastic substrate such as a PET film by a low-temperature process at around normal temperature, it is necessary to conduct a crystallization step by an annealing treatment on the obtained amorphous film to improve the electroconductivity and reliability thereof. In contrast, the transparent electro-conductive laminate makes it possible to eliminate this step. Moreover, in a case where the transparent electro-conductive laminate is produced by using the substrate film made of the polyimide as a substitute for a glass substrate, the weight of a finished product (for example, a touch panel of a tablet terminal, or the like) using the transparent electro-conductive laminate can also be reduced, because the substrate film made of the polyimide is light.

<Transparent Electro-Conductive Laminate>

A transparent electro-conductive laminate of the present invention comprises: the substrate film made of the polyimide; and the thin film made of the electro-conductive material stacked on the substrate film. Regarding the transparent electro-conductive laminate, the term "transparent" means that the total luminous transmittance is 78% or higher (more preferably 80% or higher and further preferably 82% or higher). Such a total luminous transmittance can be easily achieved by selecting, as appropriate, the kind of the polyimide of the substrate film made of a polyimide according to the present invention, the kind of the electro-conductive material, which is a material of the thin film stacked on the substrate film, and the like. Note that a value measured by using a measuring apparatus manufactured by NIPPON DENSHOKU INDUSTRIES CO., LTD. under the trade name of "Haze Meter NDH-5000" can be employed as the total luminous transmittance.

In addition, in the transparent electro-conductive laminate of the present invention, the thin film made of the electro-conductive material preferably has a surface resistivity (sheet resistance) of 1 to 100Ω/☐ (more preferably 10 to 70Ω/☐). If the surface resistivity is less than the lower limit, there is a tendency that the thickness of the thin film made of the electro-conductive material increases, so that the total luminous transmittance decreases. Meanwhile, if the surface resistivity exceeds the upper limit, the thickness of the thin film made of the electro-conductive material is reduced, and the total luminous transmittance is improved, but there is a tendency that a surface resistivity (sheet resistance) required for a transparent electrode of a solar cell, an organic EL element, a liquid crystal display device, or a touch panel of a tablet terminal is not reached. Note that the surface resistivity can be easily achieved by stacking the electro-conductive thin film on the polyimide of the present invention by using an existing sputtering apparatus for producing an ITO glass substrate under an ordinary temperature condition (for example, 250 to 350° C.). Note that, as the surface resistivity, it is possible to employ a value measured by using a surface resistance meter (for example, one manufactured by Mitsubishi Petrochemical Co., Ltd. under the trade name of "Loresta surface resistance meter MCP-TESTER Loresta-FP") as a measuring apparatus, and by employing the four-point probe method according to JIS K7194 (1994), except that the sample size is not particularly limited. Note that since the resistivity value determined by the measurement of the surface resistance by the four-point probe method is constant irrespective of the shape and the size of the sample, the sample size may be changed as appropriate, and, for example, may be 40 mm in length, 40 mm in width, and 0.05 mm in thickness.

The transparent electro-conductive laminate of the present invention is particularly useful, for example, as a transparent electrode of a solar cell, a transparent electrode of a display device (an organic EL display device, a liquid crystal display device, or the like), or the like, because a sufficiently high heat shock resistance can be obtained by the substrate film made of the polyimide, and hence formation of fractures and cracks in the thin film made of the electro-conductive material can be sufficiently suppressed even when the transparent electro-conductive laminate is exposed to a high temperature during production of a solar cell or a display device.

[Touch Panel, Solar Cell, Display Device]

A touch panel, a solar cell, and a display device of the present invention each comprise the transparent electro-conductive laminate of the present invention.

The "display device" herein is not particularly limited, as long as the transparent electro-conductive laminate can be used in the display device. Examples of the display device include liquid crystal display devices, and organic EL display devices. In addition, the structure of each of the touch panel, the solar cell, and the display device is not particularly limited, except that the structure comprises the transparent electro-conductive laminate of the present invention. A known structure can be employed as appropriate depending on the desired specifications. The structure is, for example, as follows. Specifically, the structure of the touch panel may include a transparent electrode and another transparent electrode arranged with a space provided therebetween. The structure of the solar cell may include a transparent electrode, a semiconductor layer, and an electro-conductive layer as a counter electrode. The structure of the organic EL display device may include a transparent electrode, an organic layer, and an electro-conductive layer as a counter electrode. The structure of the liquid crystal display device may include a transparent electrode, a liquid crystal layer, and an electro-conductive layer as a counter electrode. In addition, the material of each of the layers such as the organic layer, the liquid crystal layer, and the semiconductor layer is not particularly limited, and a known material can be used as appropriate. In addition, in each of the touch panel, the solar cell, and the display device of the present invention, the transparent electro-conductive laminate of the present invention is preferably used as the transparent electrode. The use of the transparent electro-conductive laminate of the present invention as the transparent electrode as described above makes it possible to produce touch panels, solar cells, and display devices at high yields with sufficiently high qualities, because formation of fractures and the like in the transparent electrode layer (the thin film made of the electro-conductive material) is sufficiently suppressed, even when the transparent electro-conductive laminate is exposed to high temperature conditions ordinarily employed in the production of touch panels, solar cells, and display devices (liquid crystal display devices and organic EL display devices).

[Transparent Film]

A transparent film of the present invention is a transparent film comprising a polyimide containing at least one repeating unit represented by the following general formula (1):

[Chem. 12]

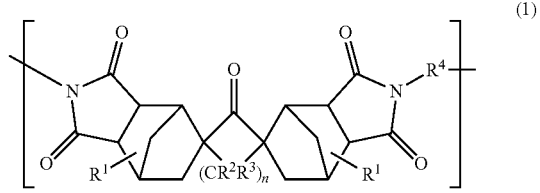

[in the formula (1), $R^1$, $R^2$, and $R^3$ each independently represent one selected from the group consisting of a hydrogen atom, alkyl groups having 1 to 10 carbon atoms, and a fluorine atom, $R^4$ represents an aryl group having 6 to 40 carbon atoms, and n represents an integer of 0 to 12], having a glass transition temperature of 350° C. to 450° C., and having a linear expansion coefficient of 30 ppm/° C. or less, the linear expansion coefficient being determined by measuring change in length under a nitrogen atmosphere and under a condition of a rate of temperature rise of 5° C./minute in a temperature range from 50° C. to 200° C.

Regarding the transparent film of the present invention, the term "transparent" means that the total luminous transmittance is 80% or higher (further preferably 85% or higher and particularly preferably 87% or higher). In addition, the polyimide forming the transparent film of the present invention is the same as that described as the polyimide forming the substrate film of the above-described transparent electro-conductive laminate of the present invention. Hence, the transparent film of the present invention has a sufficiently high heat resistance and an extremely low linear expansion coefficient, and can be used suitably as a substrate film of a transparent electro-conductive laminate. Accordingly, the transparent film of the present invention is basically the same as the above-described substrate film, and can be produced by employing the same method as the above-described method for producing a substrate film. Note that the transparent film of the present invention only needs to be a transparent film made of the polyimide, and preferred specifications such as the thickness and the size of the transparent film can be changed as appropriate depending on the application and the like.

The transparent film of the present invention has not only a sufficiently high transparency, but also a sufficiently high heat resistance and an extremely low linear expansion coefficient. Hence, even when the transparent film is exposed to a high temperature during production of a solar cell, a display device, or the like, formation of fractures and cracks can be sufficiently suppressed. Therefore, the transparent film of the present invention is particularly useful as, for example, a substrate film on which a transparent electrode of a touch panel or a solar cell is to be stacked, or a substrate film on which a transparent electrode of a display device (an organic EL display device, a liquid crystal display device, or the like) is to be stacked, as well as a film used in the applications such as FPCs, optical waveguides, image sensors, reflection plates for LEDs, covers for LED illumination, skeleton-type FPCs, coverlay films, chip-on-films, high-ductility composite substrates, liquid crystal orientation films, polyimide coating materials (buffer coating materials for DRAMs, flash memories, next generation LSIs, and the like), resists for semiconductors, and various electrical materials.

EXAMPLES

Hereinafter, the present invention will be described more specifically based on Examples and Comparative Examples. However, the present invention is not limited to Examples below.

First, methods for evaluating characteristics of compounds, substrate films, and the like obtained in Synthesis Examples, Examples, and Comparative Examples are described.

<Identification of Molecular Structures>

The molecular structures of the compounds obtained in Synthesis Examples, Examples, and the like were identified by measuring IR and NMR spectra with infrared spectrometers (FT/IR-460 and FT/IR-4100 manufactured by JASCO Corporation, and NICOLET380FT-IR manufactured by Thermo Fisher Scientific K.K.) and NMR spectrometers (trade name: UNITY INOVA-600 manufactured by VARIAN, and JNM-Lambda500 manufactured by JEOL Ltd.).

<Measurement of Glass Transition Temperatures (Tg)>

The glass transition temperatures (Tg) of the substrate films and the like obtained in Examples and Comparative Examples were measured by scanning the range from 30° C. to 440° C. by using a differential scanning calorimeter (trade name: "DSC7020" manufactured by SII NanoTechnology Inc.) under conditions of a rate of temperature rise of 10° C./minute and a rate of temperature drop of 30° C./minute under a nitrogen atmosphere.

<Measurement of 5% Weight Loss Temperature>

The 5% weight loss temperature of the compound constituting the substrate film or the like obtained in each of Examples and Comparative Examples was determined by heating a sample under a nitrogen gas flow under a condition of 10° C./minute over the range from room temperature (25° C.) to 600° C. by use of a TG/DTA7200 thermogravimetric analyzer (manufactured by SII NanoTechnology Inc.) as a measuring apparatus, and measuring a temperature at which the weight loss of the sample used reached 5%.

<Measurement of Intrinsic Viscosity [η]>

The intrinsic viscosity [η] of the polyamic acid obtained as the intermediate for producing the substrate film and the like in each of Examples and Comparative Example 1 was measured with an automatic viscometer manufactured by RIGO CO., LTD. (trade name: "VMC-252") under a temperature condition of 30° C. by preparing a measurement sample of a polyamic acid using N,N-dimethylacetamide as a solvent at a concentration of 0.5 g/dL.

<Measurement of Linear Expansion Coefficients of Substrate Films and the Like>

The linear expansion coefficient of each of the substrate films and the like obtained in Examples 1 to 7 and Comparative Examples 1 and 2 was measured as follows. Specifically, a sample having a size of 20 mm in length, 5 mm in width, and 0.05 mm (50 μm) in thickness was used. The change in length of the sample was measured from 50° C. to 200° C. by using a thermomechanical analyzer (manufactured by Rigaku Corporation under the trade name of "TMA8310") as a measuring apparatus and by employing conditions of a tensile mode (49 mN) and a rate of temperature rise of 5° C./minute under a nitrogen atmosphere. Then, the average value of the change in length per 1° C. over the temperature range from 50° C. to 200° C. was determined. Note that the linear expansion coefficient of the substrate film used in Comparative Example 3 was measured in the same manner as in Example 1, except that the sample thickness was changed to 0.1 mm (100 μm).

<Measurement of Refractive Indices of Substrate Films and the Like>

The refractive index of each of the substrate films and the like obtained in Examples and Comparative Examples was measured by using a refractive index-measuring apparatus (manufactured by Atago Co., Ltd. under the trade name of "NAR-1T SOLID") as a measuring apparatus under a light source of 589 nm and a temperature condition of 23° C.

<Measurement of Total Luminous Transmittance>

The total luminous transmittance of each of the substrate films and the like obtained in Examples and Comparative Examples and the electro-conductive laminates obtained in Examples and Comparative Examples was measured according to JIS K7361-1 by using a measuring apparatus manufactured by NIPPON DENSHOKU INDUSTRIES CO., LTD. under the trade name of "Haze Meter NDH-5000."

<Measurement of Surface Resistivities (Sheet Resistances) of Electro-Conductive Laminates>

The surface resistivity (sheet resistance) of each of the electro-conductive laminates obtained in Examples 1, 2, and 8 to 12 and Comparative Examples was measured by using a surface resistance meter (manufactured by Mitsubishi Petrochemical Co., Ltd. under the trade name of "Loresta surface resistance meter MCP-TESTER Loresta-FP") as a measuring apparatus and by employing the four-point probe method according to JIS K7194 (1994), except that a sample having a size of 40 mm in length and 40 mm in width prepared from each electro-conductive laminate (the thickness of the sample was not changed from the thickness of the electro-conductive laminate obtained in each of Examples and Comparative Examples) was used as a measurement sample.

<Evaluation Tests of Resistance to Heat Shock (Heat Shock Resistance) of Substrate Films and Electro-Conductive Laminates>

An evaluation test of the heat shock resistance of each of the films (substrate films and the like) and the electro-conductive laminates obtained in Examples 1 to 12 and Comparative Examples 1 and 3 was conducted as follows (first heat shock resistance evaluation test (measurement temperature condition: 350° C.)). Specifically, the film (substrate film or the like) or the electro-conductive laminate obtained in each of Examples and the like was placed in a vacuum oven of 350° C., left for 1 hour, and then cooled to 100° C. After the pressure was returned to normal pressure, the film and the electro-conductive laminate were taken out, and the surface state of each of the substrate film and the electro-conductive laminate was observed. In addition, the second heat shock resistance of each of the electro-conductive laminates obtained in the Examples and Comparative Example 3 was also measured by employing the same manner as in the first heat shock resistance evaluation test, except that the temperature condition of the vacuum oven was changed to 400° C. (a second heat shock resistance evaluation test (measurement temperature condition: 400° C.)).

Synthesis Example 1: Synthesis of Tetracarboxylic Dianhydride

First, to a 100-ml two-necked flask, 6.83 g of a 50% by mass aqueous dimethylamine solution (dimethylamine: 75.9 mmol) was added. Next, to a 100-ml dropping funnel, 8.19 g of a 35% by mass aqueous solution of hydrochloric acid (hydrogen chloride: 78.9 mmol) was added. Subsequently, the dropping funnel was set to the two-necked flask, and the aqueous solution of hydrochloric acid was added dropwise to the aqueous dimethylamine solution under ice-cooling. Thus, dimethylamine hydrochloride was prepared in the two-necked flask. Next, to the two-necked flask, 2.78 g (92.4 mmol) of paraformaldehyde and 2.59 g (30.8 mmol) of cyclopentanone were further added. Subsequently, a bulb condenser was set to the two-necked flask, and then the inside of the two-necked flask was replaced with nitrogen. Thereafter, the two-necked flask was immersed in an oil bath of 90° C., and heated for 3 hours with stirring. Thus, a reaction liquid was obtained which contained a Mannich base, namely, a compound represented by the general formula (I-2), where n was 2, $R^2$ and $R^3$ were all hydrogen atoms, and $R^5$ were each a methyl group. Note that the thus obtained reaction liquid was subjected to a gas chromatography analysis (GC analysis: a detector manufactured by Agilent Technologies under the trade name of "6890N" was used). As a result, it was found that the conversion of cyclopentanone was 99%.

Next, the reaction liquid in the two-necked flask was cooled to 50° C. Then, to the reaction liquid in the two-necked flask, methyl cellosolve (50 ml), 1.12 g (12.4 mmol) of a 50% by mass aqueous dimethylamine solution, and 7.13 g (108 mmol) of cyclopentadiene were added. Thus, a mixture liquid was obtained. Subsequently, the inside of the two-necked flask was replaced with nitrogen, then the mixture liquid was heated for 90 minutes by immersing the two-necked flask in an oil bath of 120° C.

The heated mixture liquid was cooled to room temperature (25° C.), and then transferred to a 200-ml separatory funnel. Then, a first extraction operation was conducted by adding n-heptane (80 ml), and then recovering the n-heptane layer. Next, a second extraction operation was conducted by adding n-heptane (40 ml) to the remaining methyl cellosolve layer, and then recovering the n-heptane layer. After that, the n-heptane layers obtained by the first and second extraction operations were mixed with each other. Thus, a n-heptane extraction liquid was obtained.

Next, the n-heptane extraction liquid was washed once with a 5% by mass aqueous sodium hydroxide (NaOH) solution (25 ml), and then once with 5% by mass aqueous hydrochloric acid (25 ml). Subsequently, the n-heptane extraction liquid washed with the aqueous hydrochloric acid was washed once with 5% by mass aqueous sodium hydrogen carbonate (25 ml), and further once with saturated aqueous sodium chloride (25 ml). Subsequently, the thus washed n-heptane extraction liquid was dried over anhydrous magnesium sulfate, and then the anhydrous magnesium sulfate was filtered off. Thus, a filtrate was obtained. Subsequently, the obtained filtrate was concentrated by using an evaporator to remove n-heptane. Thus, 7.4 g of a crude product (5-norbornene-2-spiro-2'-cyclopentanone-5'-spiro-2"-5"-norbornene) was obtained (crude yield: 99%). Next, the thus obtained crude product was subjected to Kugelrohr distillation (boiling point: 105° C./0.1 mmHg), and 4.5 g of 5-norbornene-2-spiro-2'-cyclopentanone-5'-spiro-2"-5"-norbornene was obtained (yield: 61%).

Subsequently, a tetracarboxylic dianhydride was produced by using the thus obtained 5-norbornene-2-spiro-2'-cyclopentanone-5'-spiro-2"-5"-norbornene according to the method described in Macromolecules (Vol. 27), p. 1117, published in 1994.

After the tetracarboxylic dianhydride was produced as described above, IR and NMR ($^1$H-NMR and $^{13}$C-NMR) measurements of the obtained compound were conducted. FIG. 1 shows an IR spectrum of the thus obtained compound, FIG. 2 shows a $^1$H-NMR (DMSO-d$^6$) spectrum thereof, and FIG. 3 shows a $^{13}$C-NMR (DMSO-d$^6$) spectrum thereof.

As is apparent from the results shown in FIGS. 1 to 3, the tetracarboxylic dianhydride obtained in Synthesis Example 1 was confirmed to be norbornane-2-spiro-2'-cyclopentanone-5'-spiro-2"-norbornane-5,5",6,6"-tetracarboxylic dianhydride represented by the following general formula (13):

[Chem. 13]

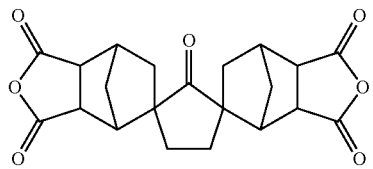

(13)

Note that the total yield of the norbornane-2-spiro-2'-cyclopentanone-5'-spiro-2"-norbornane-5,5",6,6"-tetracarboxylic dianhydride was 88%.

Example 1

First, a 30-ml three-necked flask was sufficiently dried by heating with a heat gun. Next, the gas atmosphere in the sufficiently dried three-necked flask was replaced with nitrogen to create a nitrogen atmosphere in the three-necked flask. Subsequently, 0.1337 g of o-tolidine (0.63 mmol: manufactured by Tokyo Chemical Industry Co., Ltd.: OTD) and 0.0541 g of 4,4'-diaminodiphenyl ether (0.27 mmol: manufactured by Wakayama Seika Kogyo Co., Ltd.: DDE) were introduced into the three-necked flask. Subsequently, 2.7 g of N,N-dimethylacetamide was added, and the aromatic diamine compounds (o-tolidine (OTD) and 4,4'-diaminodiphenyl ether (DDE)) were dissolved with stirring in the N,N-dimethylacetamide. Thus, a solution was obtained. Subsequently, the three-necked flask containing the solution was cooled by being immersed in a dry ice-acetone bath, and thus the solution was solidified.

Next, 0.3459 g (0.90 mmol) of the norbornane-2-spiro-2'-cyclopentanone-5'-spiro-2"-norbornane-5,5",6,6"-tetracarboxylic dianhydride obtained in Synthesis Example 1 was added to the three-necked flask containing the thus solidified solution under a nitrogen atmosphere, and then the temperature of the solution was returned to room temperature (25° C.), followed by stirring under a nitrogen atmosphere at room temperature (25° C.) for 12 hours to obtain a reaction liquid. Thus, a polyamic acid was formed in the reaction liquid. Note that, by using a portion of the reaction liquid (the dimethylacetamide solution of the polyamic acid), a dimethylacetamide solution having a polyamic acid concentration of 0.5 g/dL was prepared, and the intrinsic viscosity [η] of the polyamic acid, which was a reaction intermediate, was measured. Table 1 shows the intrinsic viscosity of the polyamic acid.

Subsequently, the reaction liquid obtained as described above was cast on a glass plate (length: 200 mm, width: 200 mm), so that the coating film had a thickness of 50 μm after being thermally cured. Thus, a coating film was formed on the glass plate. After that, the glass plate on which the coating film was formed was introduced into a vacuum oven, and the coating film was cured by heating under a pressure of 100 mmHg and under a temperature condition of 40° C. for 12 hours, and then further under a pressure of 1 mmHg and under a temperature condition of 400° C. for 1 hour. Thus, a film made of a polyimide was formed on the glass plate. Subsequently, the glass plate on which the film made of the polyimide was formed was taken out of the vacuum oven. The film made of the polyimide was recovered from the glass plate by immersing the glass plate into water of 25° C. for 12 hours, and edge portions thereof were cut off. Thus, a colorless transparent substrate film (length: 100 mm, width: 100 mm, thickness: 50 μm) made of the polyimide was obtained.

An IR spectrum of the compound forming the thus obtained substrate film was measured. FIG. 4 shows the IR spectrum of the obtained compound. As is apparent from the results shown in FIG. 4, C=O stretching vibration of imidocarbonyl was observed at 1699.0 cm$^{-1}$ for the obtained compound, and hence the obtained substrate film was confirmed to be made of a polyimide. In addition, it was found that the polyimide forming the obtained substrate film contained repeating units represented by the above-described general formula (1) on the basis of the kinds of the monomers used (the tetracarboxylic dianhydride obtained in Synthesis Example 1 and the aromatic diamine compounds (OTD and DDE)), and the measurement results of the IR spectrum. Specifically, it was found that the polyimide was a polyimide containing a repeating unit represented by the general formula (1), where $R^4$ was a group represented by the general formula (4) ($R^5$ in the formula (4) was a methyl group), and a repeating unit represented by the general formula (1), where $R^4$ was a group represented by the general formula (5) (Q in the formula (5) was a group represented by —O—).

Subsequently, a transparent thin film having a thickness of 102 nm and made of indium tin oxide (ITO, In:Sn=9:1) was stacked on a surface of the substrate film made of the polyimide by a sputtering method using "a SRV4320 model sputtering apparatus manufactured by Shinko Seiki Co., Ltd." as a sputtering apparatus and a target made of indium tin oxide (ITO, In:Sn=9:1) and employing the following conditions: pressure: 0.12 Pa, temperature of substrate film: 300° C., argon flow rate: 18 sccm, oxygen flow rate: 2 sccm, film formation time: 11 minutes 30 seconds, and RF power source: VDC·130 W. Thus, a transparent electro-conductive laminate was obtained in which the thin film made of ITO was stacked on the substrate film made of the polyimide.

Example 2

First, a 30-ml three-necked flask was sufficiently dried by heating with a heat gun. Next, the gas atmosphere in the sufficiently dried three-necked flask was replaced with nitrogen to create a nitrogen atmosphere in the three-necked flask. Subsequently, 0.1432 g of 4,4'-diaminobenzanilide (0.63 mmol: manufactured by Tokyo Chemical Industry Co., Ltd.: DBA) and 0.0541 g of 4,4'-diaminodiphenyl ether (0.27 mmol: manufactured by Wakayama Seika Kogyo Co., Ltd.: DDE) were introduced into the three-necked flask. Then, 2.7 g of N,N-dimethylacetamide was further added, and the aromatic diamine compounds (4,4'-diaminobenzanilide (DBA) and 4,4'-diaminodiphenyl ether (DDE)) were dissolved with stirring in the N,N-dimethylacetamide. Thus, a solution was obtained (DBA was partially dissolved). Subsequently, the three-necked flask containing the solution was cooled by being immersed in a dry ice-acetone bath, and thus the solution was solidified.

Next, 0.3459 g (0.90 mmol) of the norbornane-2-spiro-2'-cyclopentanone-5'-spiro-2"-norbornane-5,5",6,6"-tetracarboxylic dianhydride obtained in Synthesis Example 1 was added to the three-necked flask containing the thus solidified solution under a nitrogen atmosphere, and then the temperature of the solution was returned to room temperature (25° C.), followed by stirring under a nitrogen atmosphere at room temperature (25° C.) for 12 hours to obtain a reaction liquid. Thus, a polyamic acid was formed in the reaction liquid. Note that, by using a portion of the reaction liquid (the dimethylacetamide solution of the polyamic acid), a dimethylacetamide solution having a polyamic acid concentration of 0.5 g/dL was prepared, and the intrinsic viscosity [η] of the polyamic acid, which was a reaction intermediate, was measured. Table 1 shows the intrinsic viscosity of the polyamic acid.

Subsequently, the reaction liquid obtained as described above was cast on a glass plate (length: 200 mm, width: 200 mm), so that the coating film had a thickness of 50 μm after being thermally cured. Thus, a coating film was formed on the glass plate. After that, the glass plate on which the coating film was formed was introduced into a vacuum oven, and the coating film was cured by heating under a pressure of 100 mmHg and under a temperature condition of 40° C. for 12 hours, and then further under a pressure of 1 mmHg and under a temperature condition of 400° C. for 1 hour. Thus, a film made of a polyimide was formed on the glass plate. Subsequently, the glass plate on which the film made of the polyimide was formed was taken out of the vacuum oven. The film made of the polyimide was recovered from the glass plate by immersing the glass plate into water of 25° C. for 12 hours, and edge portions thereof were cut off. Thus, a colorless transparent substrate film (length: 100 mm, width: 100 mm, thickness: 50 μm) made of the polyimide was obtained.

An IR spectrum of the compound forming the thus obtained substrate film was measured. FIG. 5 shows the IR spectrum of the obtained compound. As is apparent from the results shown in FIG. 5, C=O stretching vibration of imidocarbonyl was observed at 1696.8 cm$^{-1}$ for the obtained compound, and hence the obtained substrate film was confirmed to be made of a polyimide. Note that it was found that the polyimide forming the obtained substrate film contained repeating units represented by the above-described general formula (1) on the basis of the kinds of the monomers used (the tetracarboxylic dianhydride obtained in Synthesis Example 1 and the aromatic diamine compounds (DBA and DDE)) and the measurement results of the IR spectrum. Specifically, it was found that the polyimide was a polyimide containing a repeating unit represented by the general formula (1), where $R^4$ is a group represented by the general formula (5) (Q in the formula (5) is a group represented by —CONH—) and a repeating unit represented by the general formula (1), where $R^4$ was a group represented by the general formula (5) (Q in the formula (5) was a group represented by —O—).

Subsequently, a transparent thin film having a thickness of 102 nm and made of indium tin oxide (ITO, In:Sn=9:1) was stacked on a surface of the substrate film made of the polyimide by a sputtering method using "a SRV4320 model sputtering apparatus manufactured by Shinko Seiki Co., Ltd." as a sputtering apparatus and a target made of indium tin oxide (ITO, In:Sn=9:1), and employing the following conditions: pressure: 0.12 Pa, temperature of substrate film: 300° C., argon flow rate: 18 sccm, oxygen flow rate: 2 sccm, film formation time: 11 minutes 30 seconds, and RF power source: VDC·130 W. Thus, a transparent electro-conductive laminate was obtained in which the thin film made of ITO was stacked on the substrate film made of the polyimide.

Example 3

First, a 30-ml three-necked flask was sufficiently dried by heating with a heat gun. Next, the gas atmosphere in the sufficiently dried three-necked flask was replaced with nitrogen to create a nitrogen atmosphere in the three-necked flask. Subsequently, 0.2045 g of 4,4'-diaminobenzanilide (0.90 mmol: manufactured by Tokyo Chemical Industry Co., Ltd.: DBA) was introduced into the three-necked flask. Then, 2.7 g of N,N-dimethylacetamide was further added, and the aromatic diamine compound (4,4'-diaminobenzanilide (DBA)) was dissolved with stirring in the N,N-dimethylacetamide. Thus, a solution was obtained (DBA was partially dissolved).

Next, 0.3459 g (0.90 mmol) of the norbornane-2-spiro-2'-cyclopentanone-5'-spiro-2"-norbornane-5,5",6,6"-tetracarboxylic dianhydride obtained in Synthesis Example 1 was added to the three-necked flask containing the solution under a nitrogen atmosphere, followed by stirring under a nitrogen atmosphere at room temperature (25° C.) for 12 hours to obtain a reaction liquid. Thus, a polyamic acid was formed in the reaction liquid. Note that, by using a portion of the reaction liquid (the dimethylacetamide solution of the polyamic acid), a dimethylacetamide solution having a polyamic acid concentration of 0.5 g/dL was prepared, and the intrinsic viscosity [η] of the polyamic acid, which was a reaction intermediate, was measured. Table 2 shows the intrinsic viscosity of the polyamic acid.

Subsequently, the reaction liquid obtained as described above was cast on a glass plate (length: 200 mm, width: 200 mm), so that the coating film had a thickness of 50 μm after being thermally cured. Thus, a coating film was formed on the glass plate. After that, the glass plate on which the coating film was formed was introduced into a vacuum oven, and the coating film was cured by heating under a pressure of 100 mmHg and under a temperature condition of 40° C. for 12 hours, and then further under a pressure of 1 mmHg and under a temperature condition of 400° C. for 1 hour. Thus, a film made of a polyimide was formed on the glass plate. Subsequently, the glass plate on which the film made of the polyimide was formed was taken out of the vacuum oven. The film made of the polyimide was recovered from the glass plate by immersing the glass plate into water of 25° C. for 12 hours, and edge portions thereof were cut off. Thus, a colorless transparent film (length: 100 mm, width: 100 mm, thickness: 50 μm) made of the polyimide was obtained.

An IR spectrum of the thus obtained film was measured. FIG. 6 shows the IR spectrum of the obtained compound. As is apparent from the results shown in FIG. 6, C=O stretching vibration of imidocarbonyl was observed at 1697.6 cm$^{-1}$ for the obtained compound, and hence the obtained film was confirmed to be made of a polyimide. In addition, it was found that the polyimide contained a repeating unit represented by the above-described general formula (1) on the basis of the measurement results of the IR spectrum, the kinds of the monomers used, and the like. Specifically, it was found that the polyimide was a polyimide containing a repeating unit represented by the general formula (1), where $R^4$ is a group represented by the general formula (5) (Q in the formula (5) is a group represented by —CONH—).

Example 4

First, a 30-ml three-necked flask was sufficiently dried by heating with a heat gun. Next, the gas atmosphere in the sufficiently dried three-necked flask was replaced with nitrogen to create a nitrogen atmosphere in the three-necked flask. Subsequently, 0.1528 g of o-tolidine (0.72 mmol: manufactured by Tokyo Chemical Industry Co., Ltd.: OTD) and 0.0360 g of 4,4'-diaminodiphenyl ether (0.18 mmol: manufactured by Wakayama Seika Kogyo Co., Ltd.: DDE) were introduced into the three-necked flask. Then, 2.7 g of N,N-dimethylacetamide was further added, and the aromatic diamine compounds (o-tolidine (OTD) and 4,4'-diaminodiphenyl ether (DDE)) were dissolved with stirring in the N,N-dimethylacetamide. Thus, a solution was obtained.

Next, 0.3459 g (0.90 mmol) of the norbornane-2-spiro-2'-cyclopentanone-5'-spiro-2''-norbornane-5,5'',6,6''-tetracarboxylic dianhydride obtained in Synthesis Example 1 was added to the three-necked flask containing the solution under a nitrogen atmosphere, followed by stirring under a nitrogen atmosphere at room temperature (25° C.) for 12 hours to obtain a reaction liquid. Thus, a polyamic acid was formed in the reaction liquid. Note that, by using a portion of the reaction liquid (the dimethylacetamide solution of the polyamic acid), a dimethylacetamide solution having a polyamic acid concentration of 0.5 g/dL was prepared, and the intrinsic viscosity [η] of the polyamic acid, which was a reaction intermediate, was measured. Table 2 shows the intrinsic viscosity of the polyamic acid.

Subsequently, the reaction liquid obtained as described above was cast on a glass plate (length: 200 mm, width: 200 mm), so that the coating film had a thickness of 50 μm after being thermally cured. Thus, a coating film was formed on the glass plate. After that, the glass plate on which the coating film was formed was introduced into a vacuum oven, and the coating film was cured by heating under a pressure of 100 mmHg and under a temperature condition of 40° C. for 12 hours, and then further under a pressure of 1 mmHg and under a temperature condition of 400° C. for 1 hour. Thus, a film made of a polyimide was formed on the glass plate. Subsequently, the glass plate on which the film made of the polyimide was formed was taken out of the vacuum oven. The film made of the polyimide was recovered from the glass plate by immersing the glass plate into water of 25° C. for 12 hours, and edge portions thereof were cut off. Thus, a colorless transparent film (length: 100 mm, width: 100 mm, thickness: 50 μm) made of the polyimide was obtained.

An IR spectrum of the compound forming the thus obtained film was measured. FIG. 7 shows the IR spectrum of the obtained compound. As is apparent from the results shown in FIG. 7, C=O stretching vibration of imidocarbonyl was observed at 1700.5 cm$^{-1}$ for the obtained compound, and hence the obtained film was confirmed to be made of a polyimide. In addition, it was found that the polyimide forming the obtained film contained repeating units represented by the above-described general formula (1) on the basis of the kinds of the monomers used (the tetracarboxylic dianhydride obtained in Synthesis Example 1 and the aromatic diamine compounds (OTD and DDE)) and the measurement results of the IR spectrum. Specifically, it was found that the polyimide was a polyimide containing a repeating unit represented by the general formula (1), where $R^4$ was a group represented by the general formula (4) ($R^5$ in the formula (4) was a methyl group) and a repeating unit represented by the general formula (1), where $R^4$ was a group represented by the general formula (5) (Q in the formula (5) was a group represented by —O—).

Example 5

First, a 30-ml three-necked flask was sufficiently dried by heating with a heat gun. Next, the gas atmosphere in the sufficiently dried three-necked flask was replaced with nitrogen to create a nitrogen atmosphere in the three-necked flask. Subsequently, 0.0876 g of p-phenylenediamine (0.81 mmol: manufactured by Aldrich: PPD) and 0.018 g of 4,4'-diaminodiphenyl ether (0.09 mmol: manufactured by Wakayama Seika Kogyo Co., Ltd.: DDE) were introduced into the three-necked flask. Then, 2.7 g of N,N-dimethylacetamide was further added, and the aromatic diamine compounds (p-phenylenediamine (PPD) and 4,4'-diaminodiphenyl ether (DDE)) were dissolved with stirring in the N,N-dimethylacetamide. Thus, a solution was obtained.

Next 0.3459 g (0.90 mmol) of the norbornane-2-spiro-2'-cyclopentanone-5'-spiro-2''-norbornane-5,5'',6,6''-tetracarboxylic dianhydride obtained in Synthesis Example 1 was added to the three-necked flask containing the solution under a nitrogen atmosphere, followed by stirring under a nitrogen atmosphere at room temperature (25° C.) for 12 hours to obtain a reaction liquid. Thus, a polyamic acid was formed in the reaction liquid. Note that, by using a portion of the reaction liquid (the dimethylacetamide solution of the polyamic acid), a dimethylacetamide solution having a polyamic acid concentration of 0.5 g/dL was prepared, and the intrinsic viscosity [η] of the polyamic acid, which was a reaction intermediate, was measured. Table 2 shows the intrinsic viscosity of the polyamic acid.

Subsequently, the reaction liquid obtained as described above was cast on a glass plate (length: 200 mm, width: 200 mm), so that the coating film had a thickness of 50 μm after being thermally cured. Thus, a coating film was formed on the glass plate. After that, the glass plate on which the coating film was formed was introduced into a vacuum oven, and the coating film was cured by heating under a pressure of 100 mmHg and under a temperature condition of 40° C. for 12 hours, and then further under a pressure of 1 mmHg and under a temperature condition of 400° C. for 1 hour. Thus, a film made of a polyimide was formed on the glass plate. Subsequently, the glass plate on which the film made of the polyimide was formed was taken out of the vacuum oven. The film made of the polyimide was recovered from the glass plate by immersing the glass plate into water of 25° C. for 12 hours, and edge portions thereof were cut off. Thus, a colorless transparent film (length: 100 mm, width: 100 mm, thickness: 50 μm) made of the polyimide was obtained.

An IR spectrum of the compound forming the thus obtained film was measured. FIG. 8 shows the IR spectrum of the obtained compound. As is apparent from the results shown in FIG. 8, C=O stretching vibration of imidocarbonyl was observed at 1699.0 cm$^{-1}$ for the obtained compound, and hence the obtained film was confirmed to be made of a polyimide. In addition, it was found that the polyimide forming the obtained film contained repeating units represented by the above-described general formula (1) on the basis of the kinds of the monomers used (the tetracarboxylic dianhydride obtained in Synthesis Example 1 and the aromatic diamine compounds (PPD and DDE)) and the measurement results of the IR spectrum. Specifically, it was found that the polyimide was a polyimide containing a repeating unit represented by the general formula (1), where $R^4$ was a group represented by the general formula (2), and a repeating unit represented by the general formula (1), where $R^4$ was a group represented by the general formula (5) (Q in the formula (5) was a group represented by —O—).

Example 6

First, a 30-ml three-necked flask was sufficiently dried by heating with a heat gun. Next, the gas atmosphere in the sufficiently dried three-necked flask was replaced with nitrogen to create a nitrogen atmosphere in the three-necked flask. Subsequently, 0.1841 g of 4,4'-diaminobenzanilide (0.81 mmol: manufactured by Tokyo Chemical Industry Co., Ltd.: DBA) and 0.0180 g of 4,4'-diaminodiphenyl ether (0.09 mmol: manufactured by Wakayama Seika Kogyo Co., Ltd.: DDE) were introduced into the three-necked flask.

Then, 2.7 g of N,N-dimethylacetamide was further added, and the aromatic diamine compounds (4,4'-diaminobenzanilide (DBA) and 4,4'-diaminodiphenyl ether (DDE)) were dissolved with stirring in the N,N-dimethylacetamide. Thus, a solution was obtained (DBA was partially dissolved).

Next, 0.3459 g (0.90 mmol) of the norbornane-2-spiro-2'-cyclopentanone-5'-spiro-2"-norbornane-5,5",6,6"-tetracarboxylic dianhydride obtained in Synthesis Example 1 was added to the three-necked flask containing the solution under a nitrogen atmosphere, followed by stirring under a nitrogen atmosphere at room temperature (25° C.) for 12 hours to obtain a reaction liquid. Thus, a polyamic acid was formed in the reaction liquid. Note that, by using a portion of the reaction liquid (the dimethylacetamide solution of the polyamic acid), a dimethylacetamide solution having a polyamic acid concentration of 0.5 g/dL was prepared, and the intrinsic viscosity [η] of the polyamic acid, which was a reaction intermediate, was measured. Table 2 shows the intrinsic viscosity of the polyamic acid.

Subsequently, the reaction liquid obtained as described above was cast on a glass plate (length: 200 mm, width: 200 mm), so that the coating film had a thickness of 50 μm after being thermally cured. Thus, a coating film was formed on the glass plate. After that, the glass plate on which the coating film was formed was introduced into a vacuum oven, and the coating film was cured by heating under a pressure of 100 mmHg and under a temperature condition of 40° C. for 12 hours, and then further under a pressure of 1 mmHg and under a temperature condition of 400° C. for 1 hour. Thus, a film made of a polyimide was formed on the glass plate. Subsequently, the glass plate on which the film made of the polyimide was formed was taken out of the vacuum oven. The film made of the polyimide was recovered from the glass plate by immersing the glass plate into water of 25° C. for 12 hours, and edge portions thereof were cut off. Thus, a colorless transparent film (length: 100 mm, width: 100 mm, thickness: 50 μm) made of the polyimide was obtained.

An IR spectrum of the compound forming the thus obtained film was measured. C=O stretching vibration of imidocarbonyl was observed at 1698.9 cm$^{-1}$ for the obtained compound, and hence the obtained film was confirmed to be made of a polyimide. In addition, it was found that the polyimide forming the obtained film contained repeating units represented by the above-described general formula (1) on the basis of the kinds of the monomers used (the tetracarboxylic dianhydride obtained in Synthesis Example 1 and the aromatic diamine compounds (DBA and DDE)) and the measurement results of the IR spectrum. Specifically, it was found that the polyimide was a polyimide containing a repeating unit represented by the general formula (1), where $R^4$ was a group represented by the general formula (5) (Q in the formula (5) was a group represented by —CONH—) and a repeating unit represented by the general formula (1), where $R^4$ was a group represented by the general formula (5) (Q in the formula (5) was a group represented by —O—).

Example 7

First, a 30-ml three-necked flask was sufficiently dried by heating with a heat gun. Next, the gas atmosphere in the sufficiently dried three-necked flask was replaced with nitrogen to create a nitrogen atmosphere in the three-necked flask. Subsequently, 0.1636 g of 4,4'-diaminobenzanilide (0.72 mmol: manufactured by Tokyo Chemical Industry Co., Ltd.: DBA) and 0.0360 g of 4,4'-diaminodiphenyl ether (0.18 mmol: manufactured by Wakayama Seika Kogyo Co., Ltd.: DDE) were introduced into the three-necked flask. Then, 2.7 g of N, N-dimethylacetamide was further added, and the aromatic diamine compounds (4,4'-diaminobenzanilide (DBA) and 4,4'-diaminodiphenyl ether (DDE)) were dissolved with stirring in the N, N-dimethylacetamide. Thus, a solution was obtained (DBA was partially dissolved).

Next, 0.3459 g (0.90 mmol) of the norbornane-2-spiro-2'-cyclopentanone-5'-spiro-2"-norbornane-5,5",6,6"-tetracarboxylic dianhydride obtained in Synthesis Example 1 was added to the three-necked flask containing the solution under a nitrogen atmosphere, followed by stirring under a nitrogen atmosphere at room temperature (25° C.) for 12 hours to obtain a reaction liquid. Thus, a polyamic acid was formed in the reaction liquid. Note that, by using a portion of the reaction liquid (the dimethylacetamide solution of the polyamic acid), a dimethylacetamide solution having a polyamic acid concentration of 0.5 g/dL was prepared, and the intrinsic viscosity [η] of the polyamic acid, which was a reaction intermediate, was measured. Table 2 shows the intrinsic viscosity of the polyamic acid.

Subsequently, the reaction liquid obtained as described above was cast on a glass plate (length: 200 mm, width: 200 mm), so that the coating film had a thickness of 50 μm after being thermally cured. Thus, a coating film was formed on the glass plate. After that, the glass plate on which the coating film was formed was introduced into a vacuum oven, and the coating film was cured by heating under a pressure of 100 mmHg and under a temperature condition of 40° C. for 12 hours, and then further under a pressure of 1 mmHg and under a temperature condition of 400° C. for 1 hour. Thus, a film made of a polyimide was formed on the glass plate. Subsequently, the glass plate on which the film made of the polyimide was formed was taken out of the vacuum oven. The film made of the polyimide was recovered from the glass plate by immersing the glass plate into water of 25° C. for 12 hours, and edge portions thereof were cut off. Thus, a colorless transparent film (length: 100 mm, width: 100 mm, thickness: 50 μm) made of the polyimide was obtained.

An IR spectrum of the compound forming the thus obtained film was measured. C=O stretching vibration of imidocarbonyl was observed at 1699.1 cm$^{-1}$ for the obtained compound, and hence the obtained film was confirmed to be made of a polyimide. In addition, it was found that the polyimide forming the obtained film contained repeating units represented by the above-described general formula (1) on the basis of the kinds of the monomers used (the tetracarboxylic dianhydride obtained in Synthesis Example 1 and the aromatic diamine compounds (DBA and DDE)) and the measurement results of the IR spectrum. Specifically, it was found that the polyimide was a polyimide containing a repeating unit represented by the general formula (1), where $R^4$ was a group represented by the general formula (5) (Q in the formula (5) was a group represented by —CONH—) and a repeating unit represented by the general formula (1), where $R^4$ was a group represented by the general formula (5) (Q in the formula (5) was a group represented by —O—).

Comparative Example 1

A 30-ml three-necked flask was sufficiently dried by heating with a heat gun. Next, the gas atmosphere in the sufficiently dried three-necked flask was replaced with nitrogen to create a nitrogen atmosphere in the three-necked flask. Subsequently, 0.1802 g of 4,4'-diaminodiphenyl ether (0.90 mmol: manufactured by Wakayama Seika Kogyo Co., Ltd.: DDE) was introduced into the three-necked flask, and then 2.7 g of N,N-dimethylacetamide was added. The 4,4'-diaminodiphenyl ether (DDE) was dissolved with stirring in the N,N-dimethylacetamide to obtain a solution. Subsequently, the three-necked flask containing the solution was cooled by being immersed in a dry ice-acetone bath, and thus the solution was solidified.

Next, 0.1963 g of pyromellitic anhydride (0.90 mmol: manufactured by Tokyo Chemical Industry Co., Ltd.) was added to the three-necked flask containing the thus solidified solution under a nitrogen atmosphere, and the temperature of the solution was returned to room temperature (25° C.), followed by stirring under a nitrogen atmosphere at room temperature (25° C.) for 12 hours. Thus, a reaction liquid was obtained. Note that since a polyamic acid was formed in the thus obtained reaction liquid, a dimethylacetamide solution having a polyamic acid concentration of 0.5 g/dL was prepared by using a portion of the reaction liquid (a dimethylacetamide solution of the polyamic acid), and the intrinsic viscosity [η] of the polyamic acid, which was a reaction intermediate, was measured. Table 1 shows the intrinsic viscosity of the polyamic acid.

Subsequently, the reaction liquid obtained as described above was cast on a glass plate (length: 200 mm, width: 200 mm), so that the coating film had a thickness of 50 μm after being thermally cured. Thus, a coating film was formed on the glass plate. After that, the glass plate on which the coating film was formed was introduced into a vacuum oven, and the coating film was cured by heating under a pressure of 100 mmHg and under a temperature condition of 40° C. for 12 hours, and then further under a pressure of 1 mmHg and under a temperature condition of 400° C. for 1 hour. Thus, a film made of a polyimide was formed on the glass plate. Subsequently, the glass plate on which the film made of the polyimide was formed was taken out of the vacuum oven. The film made of the polyimide was recovered from the glass plate by immersing the glass plate into water of 25° C. for 12 hours, and edge portions thereof were cut off. Thus, a brown substrate film (length: 80 mm, width: 80 mm, thickness 50 μm) made of the polyimide was obtained. Note that the thus obtained polyimide was an aromatic polyimide obtained by a polycondensation reaction of pyromellitic anhydride, which is an aromatic tetracarboxylic dianhydride, and 4,4'-diaminodiphenyl ether, which is an aromatic diamine compound.

An IR spectrum of the substrate film made of the aromatic polyimide was measured. FIG. 9 shows the IR spectrum of the obtained substrate film made of the polyimide. As is apparent from the results shown in FIG. 9, C=O stretching vibration of imidocarbonyl was observed at 1712.7 $cm^{-1}$ for the obtained substrate film made of the polyimide, and hence the obtained substrate film was confirmed to be made of a polyimide.

Subsequently, a transparent thin film having a thickness of 102 nm and made of indium tin oxide (ITO, In:Sn=9:1) was stacked on a surface of the substrate film made of the aromatic polyimide by a sputtering method using "a SRV4320 model sputtering apparatus manufactured by Shinko Seiki Co., Ltd." as a sputtering apparatus and a target made of indium tin oxide (ITO, In:Sn=9:1) and employing the following conditions: pressure: 0.12 Pa, temperature of substrate film: 300° C., argon flow rate: 18 sccm, oxygen flow rate: 2 sccm, film formation time: 11 minutes 30 seconds, and RF power source: VDC·130 W. Thus, an electro-conductive laminate for comparison was obtained in which the thin film made of ITO was stacked on the substrate film made of the aromatic polyimide.

Comparative Example 2

An electro-conductive laminate for comparison in which a thin film made of ITO was stacked on a substrate film (PET) was obtained in the same manner as in Example 1, except that no substrate film made of a polyimide containing a repeating unit represented by the general formula (1) was produced, but, instead of the substrate film, a commercially available PET film (manufactured by Teijin DuPont Films Japan Limited under the trade name of "Tetoron Film G2", length: 40 mm, width: 40 mm, thickness 50 μm) was used as a substrate film, and that the temperature of the substrate film was changed from 300° C. to 150° C. in the sputtering method.

Comparative Example 3

An electro-conductive laminate for comparison in which a thin film made of ITO was stacked on a substrate film (Neopulim) was obtained in the same manner as in Example 1, except that no substrate film made of a polyimide containing a repeating unit represented by the general formula (1) was produced, but, instead of the substrate film, a commercially available polyimide film (manufactured by Mitsubishi Gas Chemical Company, Inc. under the trade name of "Neopulim L-3430", length: 40 mm, width: 40 mm, thickness 100 μm) was used as a substrate film.

Table 1 shows the measurement results of characteristics of the substrate films obtained in Examples 1 and 2 and the transparent electro-conductive laminates obtained in Examples 1 and 2. Table 1 also shows measurement results of characteristics of the substrate films used in Comparative Examples 1 to 3 and the electro-conductive laminates obtained in Comparative Examples 1 to 3. Note that, in Table 1, SBNA represents norbornane-2-spiro-2'-cyclopentanone-5'-spiro-2"-norbornane-5,5",6,6"-tetracarboxylic dianhydride, DDE represents 4,4'-diaminodiphenyl ether, OTD represents o-tolidine, DBA represents 4,4'-diaminobenzanilide, and PMDA represents pyromellitic anhydride. In addition, FIG. 10 (Example 1) and FIG. 11 (Comparative Example 3) respectively show microphotographs (20 times) of surface states of the thin films made of ITO in the transparent electro-conductive laminates obtained in Example 1 and Comparative Example 3 and subjected to the first heat shock resistance evaluation test (measurement temperature condition: 350° C.)

TABLE 1

|  | Example 1 | Example 2 | Comp. Ex. 1 | Comp. Ex. 2 | Comp. Ex. 3 |
| --- | --- | --- | --- | --- | --- |
| Composition or kind of substrate film (numerical values represent composition ratio [mole ratio]) | SBNA/OTD/DDE (10:7:3) | SBNA/DBA/DDE (10:7:3) | PMDA/DDE (10:10) | PET film (Trade name: Tetoron G2) | Polyimide film (Trade name: Neopulim) |
| Viscosity (η) of polyamic acid (Unit: dL/g) | 0.49 | 0.49 | 0.42 | — | — |

TABLE 1-continued

| | Example 1 | Example 2 | Comp. Ex. 1 | Comp. Ex. 2 | Comp. Ex. 3 |
|---|---|---|---|---|---|
| Total luminous transmittance of substrate film (%) | 88 | 87 | 57 (brown: opaque) | 87 | 89 |
| Refractive index of substrate film | 1.621 | 1.629 | 1.784 | 1.655 | 1.608 |
| Glass transition temperature (Unit: °C.) | 401 | 366 | 368 | 83 | 294 |
| 5% weight loss temperature (Unit: °C.) | 491 | 496 | 501 | 403 | 489 |
| Linear expansion coefficient (Unit: ppm/°C.) | 20.1 | 27.7 | 29.5 | 26.0 | 58.0 |
| Thickness of substrate film (μm) | 50 | 50 | 50 | 50 | 100 |
| ITO film thickness (nm) | 102 | 102 | 102 | 105 | 102 |
| Substrate film temperature during ITO sputtering (Unit: °C.) | 300 | 300 | 300 | 150 | 300 |
| Total luminous transmittance of electro-conductive laminate (%) | 84 | 80 | 56 (brown: opaque) | 83 | 83 |
| Sheet resistance (Unit: Ω/□) | 39.0 | 38.5 | 38.0 | 38.5 | 38.5 |
| First heat shock resistance evaluation test on electro-conductive laminate (Measurement temperature condition: 350° C.) | Unchanged (colorless and transparent) | Unchanged (colorless and transparent) | Not conducted (because of opacity) | Not conducted | White and turbid (severe cracks) |
| Second heat shock resistance evaluation test on electro-conductive laminate (measurement temperature condition: 400° C.) | Unchanged (colorless and transparent) | Unchanged (colorless and transparent) | Not conducted (because of opacity) | Not conducted | White and turbid (severe cracks) |
| First heat shock resistance evaluation test on substrate film (measurement temperature condition: 350° C.) | Unchanged (colorless and transparent) | Unchanged (colorless and transparent) | Unchanged (opaque) | Not conducted | Irregularities as in sea mustard were formed |

As is apparent from the results shown in Table 1, it was found that the substrate films of the transparent electro-conductive laminates of the present invention (Examples 1 and 2) themselves had sufficiently excellent heat shock resistance (resistance to change in the surrounding temperature). The present inventors presume that these results are attributable to the facts that the polyimides forming the substrate films were polyimides each being represented by the general formula (1) and having a linear expansion coefficient of 30 ppm/° C. or less, and a glass transition temperature (Tg) of 350° C. or above, and that the linear expansion coefficient and the glass transition temperature (Tg) were well-balanced at high levels. In addition, as is apparent from the result shown in Table 1 and the result shown in FIG. 10, it was found that each of the transparent electro-conductive laminates of the present invention (Examples 1 and 2) had a sufficiently high transparency, and had such an extremely high heat shock resistance that the surface state of the thin film made of ITO did not change even after the first heat shock resistance evaluation test (measurement temperature condition: 350° C.) and the second heat shock resistance evaluation test (measurement temperature condition: 400° C.) were conducted. The present inventors presume that these results were achieved because of the following reason. Specifically, since each of the polyimides forming the substrate films used in Examples 1 and 2 had a linear expansion coefficient and a glass transition temperature (Tg) at high levels in a well-balanced manner, an extremely high heat shock resistance was exhibited, so that cracks or the like were not formed in the thin film made of the electro-conductive material in the laminate even when the surrounding temperature changed to a high temperature (even when the laminate was exposed to a high temperature), and the quality of the laminate could be sufficiently maintained even when the surrounding temperature changed to a high temperature. In addition, it was found that each of the transparent electro-conductive laminates of the present invention (Examples 1 and 2) had a sufficiently low sheet resistance. From these results, it has been found that the transparent electro-conductive laminates of the present invention (Examples 1 and 2) can be effectively used as transparent electrode and the like of solar cells, display devices, and the like.

In contrast, it has been found that the electro-conductive laminate obtained in Comparative Example 1 does not sufficiently function as a transparent electrode of a solar cell or the like, because the substrate film itself was brown with a total luminous transmittance of 56% and hence insufficient in terms of transparency. In addition, it can be understood without conducting the first heat shock resistance evaluation test that the electro-conductive laminate obtained in Comparative Example 2 is insufficient in terms of heat shock resistance, because the substrate film is a PET film and the Tg is as low as 83° C. Furthermore, as is apparent from the results shown in Table 1 and FIG. 11, the electro-conductive laminate obtained in Comparative Example 3 turned white and turbid in each of the first and second heat shock resistance evaluation tests, and severe cracks were observed in the thin film made of ITO. In addition, from the results of the heat shock resistance evaluation test conducted on the substrate film used in Comparative Example 3, it was found that the substrate film deformed when heated at abut 350° C. Thus, it was found that the electro-conductive laminate obtained in Comparative Example 3 resulted in an insufficient heat shock resistance, and fractures and the like were formed in the thin film made of ITO under high-temperature conditions.

From the above-described results (especially, the results shown in FIGS. 10 and 11), it has been found that, in contrast to the electro-conductive laminates for comparison (Comparative Examples 1 to 3), the transparent electro-conductive laminates of the present invention (Examples 1 and 2) have extremely high heat shock resistances, and hence are materials which can be suitably used for producing organic EL elements and solar cells during production of which process temperature of around 400° C. are employed.

In addition, Table 2 shows the measurement results of characteristics of the films obtained in Example 3 to 7. Note that, in Table 2, SBNA represents norbornane-2-spiro-2'-cyclopentanone-5'-spiro-2"-norbornane-5,5",6,6"-tetracarboxylic dianhydride, DDE represents 4,4'-diaminodiphenyl ether, OTD represents o-tolidine, DBA represents 4,4'-diaminobenzanilide, and PPD represents p-phenylenediamine.

had the linear expansion coefficient and the glass transition temperature (Tg) at high levels in a well-balanced manner. Thus, considering the results shown in Tables 1 and 2, it can be understood that each of the transparent films (Examples 3 to 7) of the present invention is sufficiently useful as a substrate film used for a transparent electro-conductive laminate and capable of exhibiting a sufficiently high heat shock resistance, as in the case of the substrate films obtained in Examples 1 and 2.

TABLE 2

|  | Example 3 | Example 4 | Example 5 | Example 6 | Example 7 |
|---|---|---|---|---|---|
| Composition of film (numerical values represent composition ratio [mole ratio]) | SBNA/DBA (10:10) | SBNA/OTD/DDE (10:8:2) | SBNA/PPD/DDE (10:9:1) | SBNA/DBA/DDE (10:9:1) | SBNA/DBA/DDE (10:8:2) |
| Viscosity (η) of polyamic acid (Unit: dL/g) | 0.67 | 0.72 | 0.77 | 0.94 | 0.53 |
| Total luminous transmittance of film (%) | 87 | 87 | 87 | 87 | 86 |
| Refractive index of film | 1.632 | 1.625 | 1.602 | 1.631 | 1.630 |
| Glass transition temperature (Unit: ° C.) | 369 | 409 | 390 | 365 | 364 |
| 5% weight loss temperature (Unit: ° C.) | 481 | 486 | 498 | 492 | 496 |
| Linear expansion coefficient (Unit: ppm/° C.) | 6.0 | 14.9 | 27.9 | 7.3 | 15.4 |
| Film thickness (μm) | 50 | 50 | 50 | 50 | 50 |
| First heat shock resistance evaluation test on film (measurement temperature condition: 350° C.) | Unchanged (colorless and transparent) | Unchanged (colorless and transparent) | Unchanged (colorless and transparent) | Unchanged (colorless and transparent) | Unchanged (colorless and transparent) |

As is apparent from the results of the characteristics of the films shown in Table 2, it was found that each of the films obtained in Examples 3 to 7 was made of a polyimide containing a repeating unit represented by the general formula (1), having a linear expansion coefficient of 30 ppm/° C. or less, and having a glass transition temperature (Tg) of 350° C. or above, and also had a sufficiently high transparency. Considering these results shown in Table 2 and the results shown in Table 1 shows in combination (for example, considering the fact that the film obtained in Comparative Example 1 was brown with a total luminous transmittance of 56% and the like in combination), it was found that each of the films obtained in Examples 3 to 7 (the transparent films of the present invention) not only had a sufficiently high transparency, but also had a linear expansion coefficient and a glass transition temperature (Tg) at sufficiently high levels in a well-balanced manner. It was found that especially the films obtained Examples 3, 4, 6, and 7 had lower linear expansion coefficients of 15.4 ppm/° C. or less. In addition, it was also found that each of the transparent films (Examples 3 to 7) of the present invention had a sufficiently excellent heat shock resistance (resistance against change in the surrounding temperature). The present inventors presume that these results are attributable to the fact that each of the polyimides forming the transparent films of the present invention (Examples 3 to 7) was a polyimide being represented by the general formula (1), having a linear expansion coefficient of 30 ppm/° C. or less, and having a glass transition temperature (Tg) of 350° C. or above, and Example 8 to 12

Transparent electro-conductive laminates in each of which a thin film made of ITO was stacked on a substrate film made of a polyimide was produced in the same manner as in Example 1, except that the colorless transparent films (length: 100 mm, width: 100 mm, thickness: 50 μm) made of the polyimides obtained in Examples 3 to 7 were used as the colorless transparent substrate films made of polyimides, respectively.

Specifically, each of the colorless transparent films (length: 100 mm, width: 100 mm, thickness: 50 μm) made of the polyimides obtained in Examples 3 to 7 was used as the substrate film, and a transparent thin film having a thickness of 102 nm and made of indium tin oxide (ITO, In:Sn=9:1) was stacked on a surface of the substrate film made of the polyimide by a sputtering method using "a SRV4320 model sputtering apparatus manufactured by Shinko Seiki Co., Ltd." as a sputtering apparatus and a target made of indium tin oxide (ITO, In:Sn=9:1), and employing the following conditions: pressure: 0.12 Pa, temperature of substrate film: 300° C., argon flow rate: 18 sccm, oxygen flow rate: 2 sccm, film formation time: 11 minutes 30 seconds, and RF power source: VDC·130 W. Thus, each transparent electro-conductive laminate was obtained in which the thin film made of ITO was stacked on each of the films (substrate films) made of the polyimides obtained in Examples 3 to 7. Table 3 shows the measurement results of characteristics of the transparent electro-conductive laminates thus obtained in Examples 8 to 12.

TABLE 3

| | Example 8 | Example 9 | Example 10 | Example 11 | Example 12 |
|---|---|---|---|---|---|
| Kind of substrate film | Film obtained in Example 3 | Film obtained in Example 4 | Film obtained in Example 5 | Film obtained in Example 6 | Film obtained in Example 7 |
| Thickness of substrate film (μm) | 50 | 50 | 50 | 50 | 50 |
| ITO film thickness (nm) | 102 | 102 | 102 | 102 | 102 |
| Substrate film temperature during ITO sputtering (Unit: ° C.) | 300 | 300 | 300 | 300 | 300 |
| Total luminous transmittance of electro-conductive laminate (%) | 83 | 84 | 84 | 84 | 83 |
| Sheet resistance (Unit: Ω/□) | 38.5 | 38.5 | 38.5 | 38.5 | 38.5 |
| First heat shock resistance evaluation test on electro-conductive laminate (measurement temperature condition: 350° C.) | Unchanged (colorless and transparent) | Unchanged (colorless and transparent) | Unchanged (colorless and transparent) | Unchanged (colorless and transparent) | Unchanged (colorless and transparent) |
| Second heat shock resistance evaluation test on electro-conductive laminate (measurement temperature condition: 400° C.) | Unchanged (colorless and transparent) | Unchanged (colorless and transparent) | Unchanged (colorless and transparent) | Unchanged (colorless and transparent) | Unchanged (colorless and transparent) |

As is apparent from the results shown in Table 3, it was found that each of the transparent electro-conductive laminates of the present invention (Examples 8 to 12) using the films obtained in Examples 3 to 7 as the substrate films had a sufficiently high transparency, and had an extremely high heat shock resistance, so that the surface state of the thin film made of ITO did not change even after the first heat shock resistance evaluation test (measurement temperature condition: 350° C.) and the second heat shock resistance evaluation test (measurement temperature condition: 400° C.) were conducted. From these results, it has been found that the transparent electro-conductive laminates of the present invention (Examples 8 to 12) have extremely high heat shock resistance, and hence are materials which can be used for producing organic EL elements and solar cells during production of which process temperatures of around 400° C. are employed. Note that the present inventors presume that these results were achieved because of the following reason. Specifically, since each of the polyimides forming the films obtained in Examples 3 to 7 and used as the substrate films had a linear expansion coefficient and a glass transition temperature (Tg) at high levels in a well-balanced manner, an extremely high heat shock resistance was exhibited, so that cracks or the like were not formed in the thin film made of the electro-conductive material in the laminate even when the surrounding temperature changed to a high temperature (even when the laminate was exposed to a high temperature), and the quality of the laminate could be sufficiently maintained even when the surrounding temperature changed to a high temperature. In addition, it was found that each of the transparent electro-conductive laminates of the present invention (Examples 8 to 12) had a sufficiently low sheet resistance. From these results, it has been found that the transparent electro-conductive laminates of the present invention (Examples 8 to 12) can be effectively used as transparent electrodes and the like of solar cells, display devices, and the like.

INDUSTRIAL APPLICABILITY

As described above, according to the present invention, it is possible to provide a transparent electro-conductive laminate which has a sufficiently high heat shock resistance, and whose quality deterioration can be sufficiently suppressed even under a high-temperature heating condition as employed during the production of a solar cell, a liquid crystal display device, or the like, as well as a touch panel, a solar cell, and a display device using the transparent electro-conductive laminate. In addition, according to the present invention, a transparent film which is made of a polyimide having an excellent heat resistance and a sufficiently low linear expansion coefficient and which can be suitably used as the substrate film of the transparent electro-conductive laminate and the like.

The transparent electro-conductive laminate of the present invention is excellent in transparency and heat shock resistance, and hence is particularly useful as a material and the like for transparent electrodes of display devices such as liquid crystal display devices and organic EL display devices, solar cells, touch panels, and the like.

The invention claimed is:
1. A transparent electro-conductive laminate comprising:
a substrate film made of a polyimide; and
a thin film made of an electro-conductive material and stacked on the substrate film, wherein
the polyimide is a polyimide comprising:
a repeating unit (A) that is one group selected from the group consisting of groups represented by the general formula (1), where $R^4$ is represented by the general formula (4); and groups represented by the general formula (1), where $R^4$ is represented by the general formula (5), where Q is one of groups represented by —CONH—, —COO—, —CO—, and —$C_6H_4$—, and
a repeating unit (B) that is one group selected from the group consisting of groups represented by the gen- eral formula (1), where R⁴ is represented by the general formula (2); and groups represented by the general formula (1), where R⁴ is represented by the general formula (5), where Q is one of groups represented by —O—, —S—, —CH₂—, and —O—C₆H₄—O—;

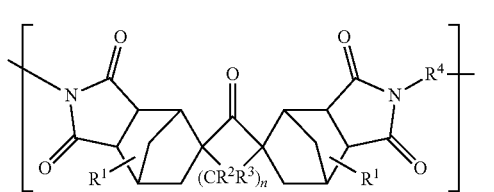
(1)

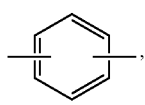
(2)

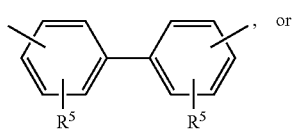
(4)
, or

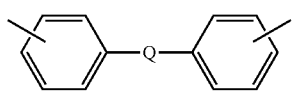
(5)

wherein in the formula (1), R¹, R², and R³ each independently represent one selected from the group consisting of a hydrogen atom, alkyl groups having 1 to 10 carbon atoms, and a fluorine atom, n represents an integer of 0 to 12, and wherein in the formula (4), R⁵ represents one selected from the group consisting of a hydrogen atom, a fluorine atom, a methyl group, an ethyl group, and a trifluoromethyl group, having a glass transition temperature of 350° C. to 450° C., and having a linear expansion coefficient of 30 ppm/° C. or less, the linear expansion coefficient being determined by measuring change in length under a nitrogen atmosphere and under a condition of a rate of temperature rise of 5° C./minute in a temperature range from 50° C. to 200° C.

2. The transparent electro-conductive laminate according to claim 1, wherein the repeating unit (A) is one group selected from the group consisting of groups represented by the general formula (1), where R⁴ is represented by the general formula (4); and groups represented by the general formula (1), where R⁴ is represented by the general formula (5), where Q is one of groups represented by —CONH— and —COO—, and the repeating unit (B) is one group selected from the group consisting of groups represented by the general formula (1), where R⁴ is represented by the general formula (5), where Q is one of groups represented by —O— and —CH₂—.

3. A touch panel comprising the transparent electroconductive laminate according to claim 1.

4. A solar cell comprising the transparent electro-conductive laminate according to claim 1.

5. A display device comprising the transparent electro-conductive laminate according to claim 1.

6. A transparent film comprising a polyimide comprising:

a repeating unit (A) that is one group selected from the group consisting of groups represented by the general formula (1), where R⁴ is represented by the general formula (4); and groups represented by the general formula (1), where R⁴ is represented by the general formula (5), where Q is one of groups represented by —CONH—, —COO—, —CO—, and —C₆H₄—, and a repeating unit (B) that is one group selected from the group consisting of groups represented by the general formula (1), where R⁴ is represented by the general formula (2); and groups represented by the general formula (1), where R⁴ is represented by the general formula (5), where Q is one of groups represented by —O—, —S—, —CH₂—, and —O—C₆H₄—O—:

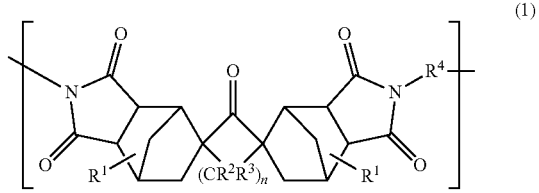
(1)

(2)

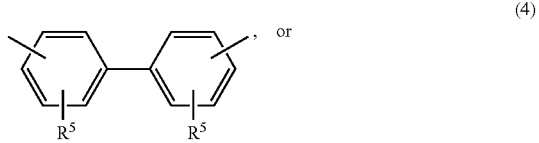
(4)
, or

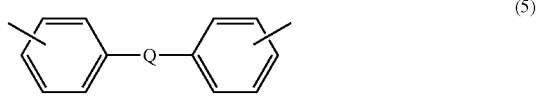
(5)

wherein in the formula (1), R¹, R², and R³ each independently represent one selected from the group consisting of a hydrogen atom, alkyl groups having 1 to 10 carbon atoms, and a fluorine atom, n represents and integer of 0 to 12, wherein in the formula (4), R⁵ represents one selected from the group consisting of a hydrogen atom, a fluorine atom, a methyl group, an ethyl group, and a trifluoromethyl group, and wherein the formula (5), having a glass transition temperature of 350° C. to 450° C., and having a linear expansion coefficient of 30 ppm/° C. or less, the linear expansion coefficient being determined by measuring change in length under a nitrogen atmosphere and under a condition of a rate of temperature rise of 5° C./minute in a temperature range from 50° C. to 200° C.

* * * * *